(12) United States Patent
Xing et al.

(10) Patent No.: US 11,508,442 B2
(45) Date of Patent: Nov. 22, 2022

(54) NON-VOLATILE MEMORY SYSTEM USING STRAP CELLS IN SOURCE LINE PULL DOWN CIRCUITS

(71) Applicant: Silicon Storage Technology, Inc., San Jose, CA (US)

(72) Inventors: Leo Xing, Shanghai (CN); Chunming Wang, Shanghai (CN); Xian Liu, Sunnyvale, CA (US); Nhan Do, Saratoga, CA (US); Guangming Lin, Shanghai (CN); Yaohua Zhu, Shanghai (CN)

(73) Assignee: SILICON STORAGE TECHNOLOGY, INC., San Jose, CA (US)

(*) Notice: Subject to any disclaimer, the term of this patent is extended or adjusted under 35 U.S.C. 154(b) by 0 days.

(21) Appl. No.: 17/074,103

(22) Filed: Oct. 19, 2020

(65) Prior Publication Data
US 2021/0327512 A1 Oct. 21, 2021

(30) Foreign Application Priority Data
Apr. 17, 2020 (CN) ............... 202010304167.2

(51) Int. Cl.
*G11C 16/12* (2006.01)
*G11C 16/26* (2006.01)
*G11C 16/14* (2006.01)
(52) U.S. Cl.
CPC .............. *G11C 16/12* (2013.01); *G11C 16/14* (2013.01); *G11C 16/26* (2013.01); *G11C 2216/04* (2013.01)

(58) Field of Classification Search
CPC .......... G11C 16/12; G11C 16/14; G11C 16/26
USPC ....................................... 365/185.05
See application file for complete search history.

(56) References Cited

U.S. PATENT DOCUMENTS

| 9,564,238 | B1* | 2/2017 | Bai ................. G11C 16/0425 |
| 9,659,634 | B2* | 5/2017 | Liaw .................. G11C 11/412 |
| 2010/0008141 | A1 | 1/2010 | Chu |
| 2010/0188900 | A1 | 7/2010 | Tran |
| 2010/0226181 | A1 | 9/2010 | Tran |
| 2015/0029785 | A1* | 1/2015 | Liaw .................. G11C 11/419 365/154 |
| 2018/0204627 | A1 | 7/2018 | Tran |
| 2020/0105775 | A1 | 4/2020 | Huang |

FOREIGN PATENT DOCUMENTS

| TW | I 564895 B | 1/2017 |
| WO | 2017/044251 A1 | 3/2017 |

OTHER PUBLICATIONS

Taiwanese Office Action dated Nov. 12, 2021 corresponding to the related Taiwanese Patent Application No. 110113519.

* cited by examiner

*Primary Examiner* — Xiaochun L Chen
(74) *Attorney, Agent, or Firm* — DLA Piper LLP US

(57) ABSTRACT

The present invention relates to a flash memory device that uses strap cells in a memory array of non-volatile memory cells as source line pull down circuits. In one embodiment, the strap cells are erase gate strap cells. In another embodiment, the strap cells are source line strap cells. In another embodiment, the strap cells are control gate strap cells. In another embodiment, the strap cells are word line strap cells.

14 Claims, 24 Drawing Sheets

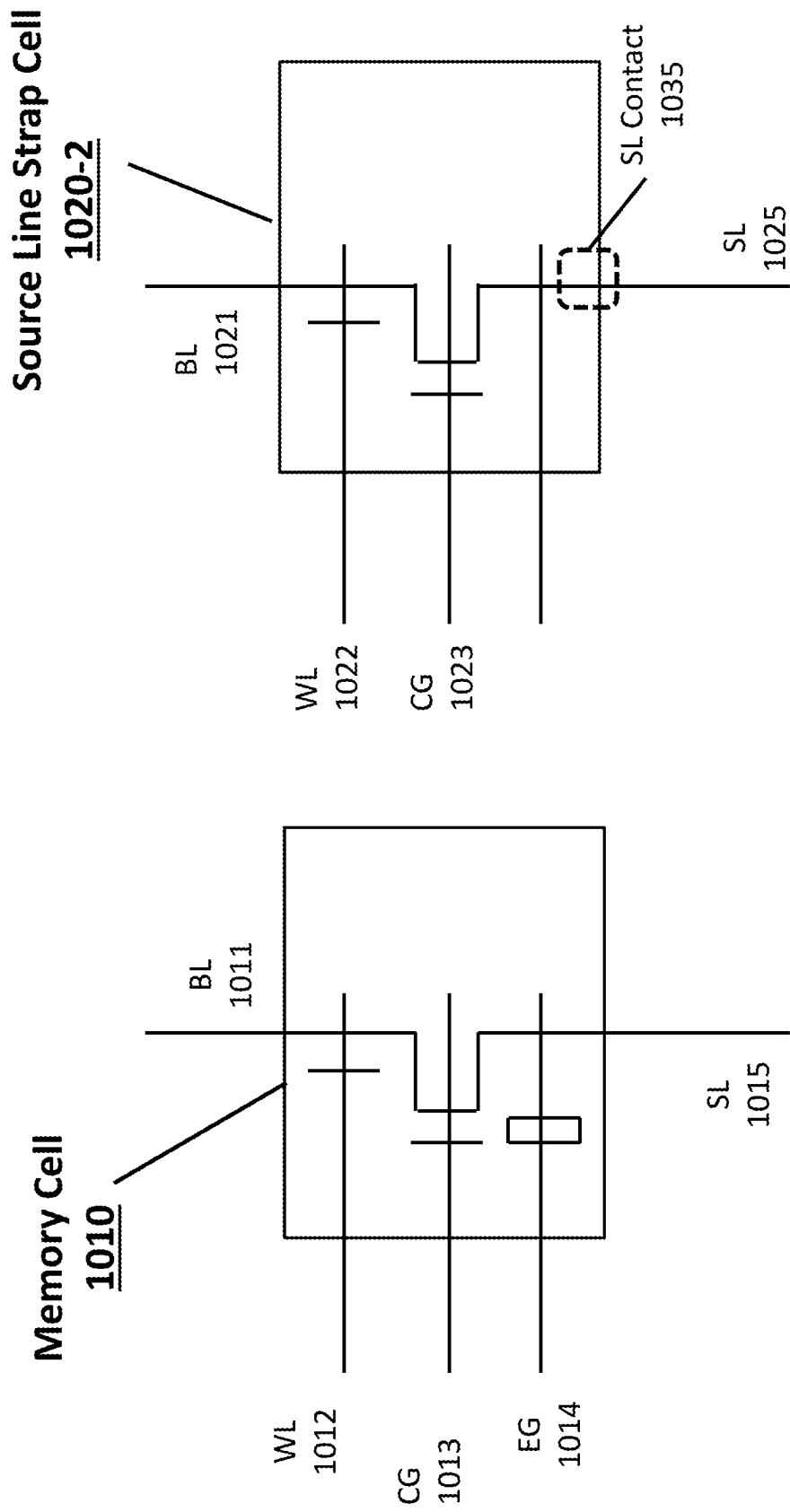

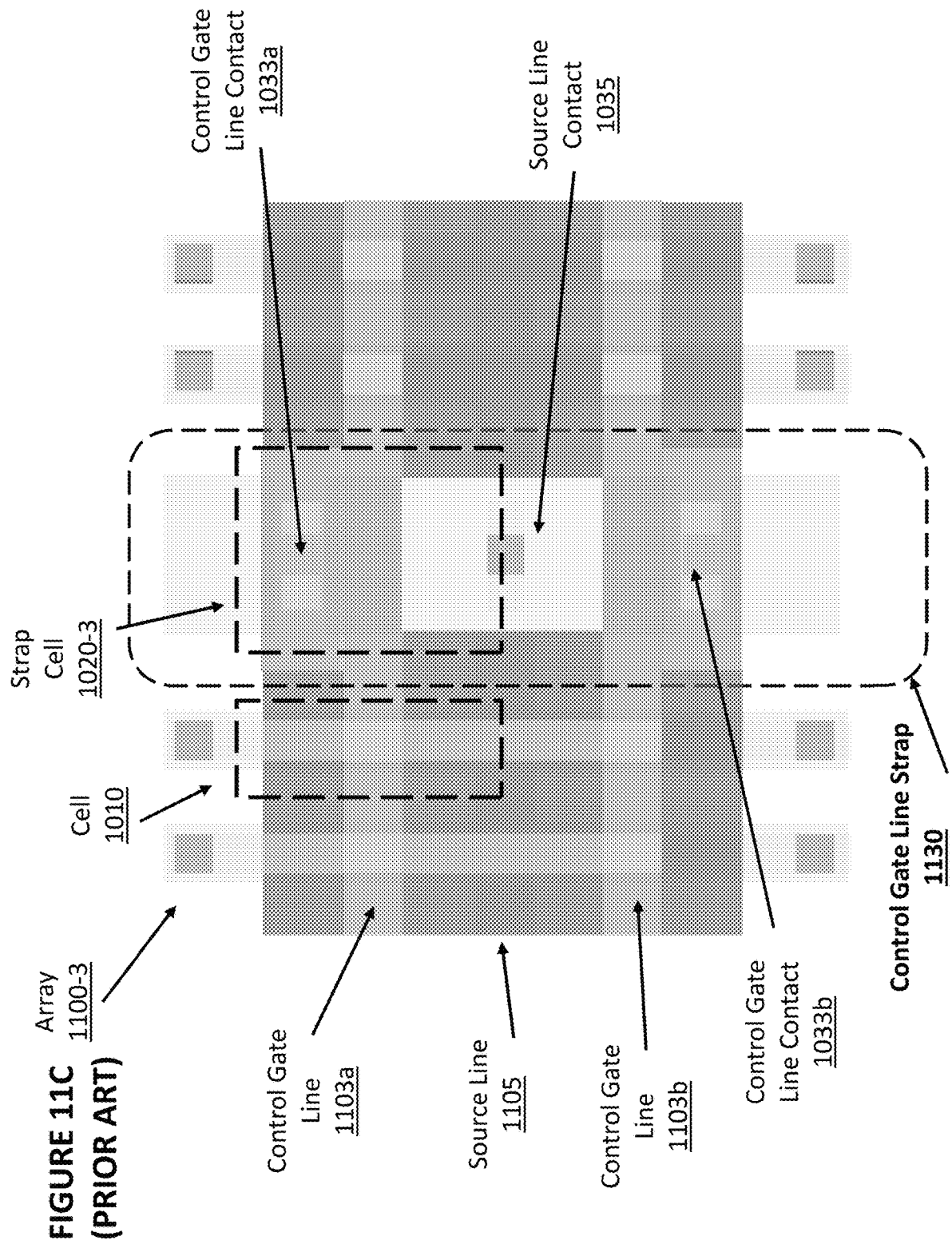

NON-VOLATILE MEMORY SYSTEM USING STRAP CELLS IN SOURCE LINE PULL DOWN CIRCUITS

RELATED APPLICATION

This application claims the benefit of Chinese Patent Application No. 202010304167.2, filed Apr. 17, 2020.

TECHNICAL FIELD

The present invention relates to a non-volatile memory device that utilizes existing strap cells in the array in source line pull down circuits.

BACKGROUND OF THE INVENTION

Non-volatile memory cells are well known in the art. Examples of non-volatile memory cells known in the prior art are shown in FIGS. 1-6.

FIG. 1 depicts stacked-gate non-volatile memory cell 110. Each memory cell 110 includes source region (also referred to as source line terminal) 14 and drain region 16 formed in semiconductor substrate 12, with channel region 18 there between. Floating gate 20 is formed over and insulated from (and controls the conductivity of) channel region 18, and over a portion of each of the drain region 16 and the source region 14. Control gate terminal 22 (which here is coupled to a word line) is disposed over and insulated from floating gate 20. The floating gate 20 and control gate terminal 22 are insulated from each other and from the substrate 12 by a gate oxide. Bitline terminal 24 is coupled to drain region 16.

Programming is performed using hot electron injection from channel 18 to floating gate 20 in the channel region next to the drain region 16.

Erasing is performed using by Fowler-Nordheim electron tunneling from floating gate 20 to substrate 12.

Reading is performed by placing positive read voltages on the drain region 16 and control gate terminal 22 (which turns on channel region 18). If the floating gate 20 is positively charged (i.e. erased of electrons), then channel region 18 under the floating gate 20 is turned on as well, and current will flow across the channel region 18, which is sensed as the erased or "1" state. If the floating gate 20 is negatively charged (i.e. programmed with electrons), then the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 and substrate 12 for performing read, erase, and program operations:

TABLE NO. 1

Operation of Stacked-Gate Non-Volatile Memory Cell 110 of FIG. 1

|  | CG | BL | SL | Substrate |
|---|---|---|---|---|
| Read 1 | 0-5 V | 0.1-2 V | 0-2 V | 0 V |
| Read 2 | 0.5-2 V | 0-2 V | 2-0.1 V | 0 V |
| Erase | −8 to −10 V/0 V | FLT | FLT | 8-10 V/15-20 V |
| Program | 8-12 V | 3-5 V/0 V | 0 V/3-5 V | 0 V |

"Read 1" is a read mode in which the cell current is output on the bit line. "Read 2" is a read mode in which the cell current is output on source line terminal 14. In the program mode, the bit line terminal is set to VDD (typically 3-5 V) and the source line terminal is set to 0 V to inhibit programming of the cell, and the bit line terminal is set to 0 V and the source line terminal is set to VDD (typically 3-5 V) to program the cell.

FIG. 2 depicts split-gate non-volatile memory cell 210. Each memory cell 210 includes source region (source line terminal) 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline terminal 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the drain region 16 towards the source region 14 (source line terminal). The electrons will accelerate and become energized (heated) when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 2 depicts typical voltage ranges that can be applied to the terminals of memory cell 210 for performing read, erase, and program operations:

TABLE NO. 2

Operation of Non-Volatile Memory Cell 210 of FIG. 2

|  | WL | BL | SL |
|---|---|---|---|
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 µA | 9-10 V |

"Read 1" is a read mode in which the cell current is output on the bit line. "Read 2" is a read mode in which the cell current is output on source line terminal 14.

FIG. 3 depicts split-gate non-volatile memory cell 310. Memory cell 310 is similar to memory cell 210 of FIG. 2 with the addition of control gate (CG) terminal 28. Control gate terminal 28 is biased at a high positive voltage, e.g., 10V, in programming, low or negative voltage in erase, e.g., 0 v/−8V, low or mid-range voltage in read, e.g., 0 v/2.5V. Other terminals are biased similarly to that of FIG. 2.

FIG. 4 depicts split-gate non-volatile memory cell 410. Memory cell 410 comprises source region (source line terminal) 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 3 depicts typical voltage ranges that can be applied to the terminals of memory cell 410 for performing read, erase, and program operations:

TABLE NO. 3

Operation of Non-Volatile Memory Cell 410 of FIG. 4

|         | WL/SG     | BL      | CG        | EG       | SL        |
|---------|-----------|---------|-----------|----------|-----------|
| Read 1  | 0.5-2 V   | 0.1-2 V | 0-2.6 V   | 0-2.6 V  | 0 V       |
| Read 2  | 0.5-2 V   | 0-2 V   | 0-2.6 V   | 0-2.6 V  | 2-0.1 V   |
| Erase   | −0.5 V/0 V| 0 V     | 0 V/−8 V  | 8-12 V   | 0 V       |
| Program | 1 V       | 1 µA    | 8-11 V    | 4.5-9 V  | 4.5-5 V   |

"Read 1" is a read mode in which the cell current is output on the bit line. "Read 2" is a read mode in which the cell current is output on the source line terminal.

FIG. 5 depicts split-gate non-volatile memory cell 510. Memory cell 510 is similar to memory cell 410 of FIG. 4 except that memory cell 510 does not contain an erase gate EG terminal. Programming is performed by heated electrons from the channel region 18 injecting themselves onto the floating gate 20. An erase is performed by biasing the substrate 12 to a high voltage and biasing the control gate CG terminal 28 to a low or negative voltage such that electrons tunnel from the floating gate 20 to the channel region 18. Alternatively, an erase is performed by biasing word line terminal 22 to a positive voltage and biasing control gate terminal 28 to a negative voltage such that electrons tunnel from the floating gate 20 to the word line terminal 22. Programming and reading is similar to that of FIG. 4.

FIG. 6 depicts split-gate non-volatile memory cell 610. Memory cell 610 is identical to the memory cell 410 of FIG. 4 except that memory cell 610 does not have a separate control gate terminal. The erase operation (whereby erasing occurs through use of the erase gate terminal) and read operation are similar to that of the FIG. 4 except there is no control gate bias applied. The programming operation also is done without the control gate bias, and as a result, a higher voltage must be applied on the source line terminal 14 during a program operation to compensate for a lack of control gate bias.

Table No. 4 depicts typical voltage ranges that can be applied to the terminals of memory cell 610 for performing read, erase, and program operations:

TABLE NO. 4

Operation of Non-Volatile Memory Cell 610 of FIG. 6

|         | WL/SG     | BL      | EG       | SL      |
|---------|-----------|---------|----------|---------|
| Read 1  | 0.5-2.2 V | 0.1-2 V | 0-2.6 V  | 0 V     |
| Read 2  | 0.5-2.2 V | 0-2 V   | 0-2.6 V  | 2-0.1 V |
| Erase   | −0.5 V/0 V| 0 V     | 11.5 V   | 0 V     |
| Program | 1 V       | 2-3 µA  | 4.5 V    | 7-9 V   |

"Read 1" is a read mode in which the cell current is output on the bit line. "Read 2" is a read mode in which the cell current is output on the source line terminal.

Memory cells of the types shown in FIGS. 1-6 typically are arranged into rows and columns to form an array. Erase operations are performed on entire rows or pairs of rows at one time, since each word lines controls a row of memory cells and is coupled to word line terminal 22 of each cell in that row, and erase gate lines (when present) are shared by pairs of rows of memory cells and are coupled to erase gate terminals 30 of each cell in those pairs of rows. Source lines typically are coupled to source line terminals 14 of one row of memory cells or two adjacent rows of memory cells. Bitlines typically are coupled to bit line terminals 24 of one column of memory cells 24.

For each of the prior art memory cells of FIGS. 1-6, and as can be seen in the above Tables, it often is necessary to pull the source line down to ground, i.e. to 0 volts, and to do so relatively quickly.

FIG. 7 depicts a typical prior art technique for doing this. Memory system 700 comprises memory cell 710, word line 722, control gate line 726, erase gate line 728, bit line 720, and source line 714. Memory cell 710 can be any of the types shown in FIGS. 1-6, namely, memory cell 110, memory cell 210, memory cell 310, memory cell 410, memory cell 510, memory cell 610, or another type of memory cell. Source line 714 is coupled to pull down transistor 730, which here comprises a single NMOS transistor. When the gate of pull down transistor 730 is activated, source line 714 is pulled down to ground. In a flash memory system, numerous pull down circuits will be required, and each source line 714 may require more than one pull down circuit depending on the capacitance of the source line 714. The pull down transistors 714 require operating voltages of around 0-1.2 V for low voltage operations and 4-5-11.5 V for high voltage operations, as shown in Tables 1-4. This means that pull down transistor 730 needs one or both of a high voltage transistor type (e.g., 11.5V transistor) or an IO transistor type (e.g., 2.5V or 3V transistor), which takes up die space and increases the overall cost and complexity of the system. In the situation where both types are present, they typically will be connected to ground on one end and to a multiplexor on the other end, where the multiplexor connects one of the transistors to the source line in response to a control signal. In addition, the pull down transistors can incur overstress and breakdown when memory cell 710 is programmed.

Applicant presented an improvement over memory system 700 in PCT Publication No. WO 2017/044251 A1, titled "Flash Memory System Using Dummy Memory Cell As Source Line Pull Down Circuit," which is incorporated herein by reference. This memory system is depicted in FIGS. 8 and 9.

With reference to FIG. 8, flash memory system 800 comprises exemplary memory cell 710 and exemplary dummy memory cell 810. Dummy memory cell 810 is of the same construction as memory cell 710 except that dummy memory cell 810 is not used to store data. Source line 714 of memory cell 710 is coupled to source line 814 of dummy memory cell 810, as would typically be the case if memory cell 710 and dummy memory cell 810 are in the same row within an array. Word line 722 is coupled to word line 822, and bit line 720 is shared among memory cells 800 of the column.

In the example shown, memory cell 710 and dummy memory cell 810 follow the design of memory cell 410 in FIG. 4. It will be understood that memory cell 710 and dummy memory cell 810 also can follow the design of memory cell 310 in FIG. 3 or memory cell 510 in FIG. 5 (in which case erase gates 728 and 828 will not be present), of memory cell 610 in FIG. 6 (in which case control gates 726 and 826 will not be present), or of memory cell 110 in FIG. 1 or memory cell 210 in FIG. 2 (in which case erase gates 728 and 828 and control gate 726 and 826 will not be present).

When memory cell 710 is in read mode or erase mode, source line 814 is coupled to ground through the dummy memory cell 810 and dummy bitline 820, which is switchably coupled to ground, which results in source line 714 and source line 814, anything else that is electrically connected to bit line 820, being pulled to ground. Dummy memory cells 810 are required to be erased before a read operation.

When the memory cell 710 is in program mode, dummy bitline 820 is switchably coupled to an inhibit voltage such as VDD. This will place dummy memory cell 810 in a program inhibit mode which maintains dummy memory cell 810 in an erased state. There can be a plurality of dummy memory cells 810 for each memory cell 710 to strengthen the pull down of the source line 714 to ground.

FIG. 9 depicts flash memory system 900, which comprises exemplary memory cells 920 and exemplary dummy memory cell circuit 910. Dummy memory cell circuit 910 comprises a plurality of dummy memory cells coupled to one another. In this example, source line 930 (also labeled SL0) and source line 940 (also labeled SL1) from memory cells 920 are coupled to source line terminals of dummy memory cell circuit 910. In this example, source line 930 SL0 and source line 940 SL1 are connected together.

Thus, the source lines for an entire sector or sectors of memory cells 920 can be coupled together to a source line of dummy memory cell circuit 910 comprising dummy memory cells from the same rows of cells that are part of the sector or sectors.

When memory cells 920 are in read mode or erase mode, dummy memory cell circuit 910 will be coupled to ground through the dummy bitlines. The dummy memory cells are required to be erased before a read operation. The erased dummy memory cells, when coupled to ground through the dummy bitlines will pull source lines 930 and 940 to ground.

When memory cells 920 are in program mode, the dummy bitlines of dummy memory cell circuit 910 will be coupled to an inhibit voltage such as VDD. This will place the dummy memory cells of dummy memory cell circuit 910 in a program inhibit mode, which maintains the dummy memory cells in an erased state.

Optionally, word line 950 (also labeled WL_rdcellpdwn, which is separate from wordlines of the memory cell 920) and control gate 960 (also labeled CG_rdcellpdwn, which is separate from control gates of the memory cell 920) are biased at a different voltage than that of the memory cell 920, such as VDD or higher, during read or standby modes to minimize the current drop across the dummy memory cells of dummy memory cell circuit 910.

The systems of FIGS. 8 and 9 have numerous benefits over the prior art system of FIG. 7. First, the source line pull down current is distributed among many dummy memory cells and metal paths, which results in lower electromagnetic interference and less decoding interconnection. Second, there is less power dissipation across the dummy memory cells compared to the pull down high voltage transistors of the prior art. Third, the embodiments require less die space versus the high voltage transistor pull down solution. Fourth, bias and logic control of the embodiments are simpler than that of the pull down transistors of the prior art. This results in less overstress and breakdown during programming modes.

However, the embodiments of FIGS. 8 and 9 require additional die space for the dummy memory cells of the dummy memory cell circuit. This increases the size, complexity, and manufacturing cost of the die.

Prior art memory systems also contain strap cells. FIGS. 10A, 10B, 10C, and 10D depict prior art memory systems 1000-1, 1000-2, 1000-3, and 1000-4, respectively, which comprise exemplary memory cell 1010 and exemplary strap cell 1020, i.e. exemplary strap cell 1020-1, 1020-2, 1020-3 and 1020-4, respectively. Strap cell 1020 is part of a strap row or a strap column that typically is present in the array as an area in which physically connections can be made between one or more of erase gate lines, source lines, control gate lines, and word lines and another structure outside of the array (such as a driver, low voltage decoder, or high voltage decoder). Strap cell 1020 contains some, but not always all, of the same components as memory cell 1010.

In each of the examples shown in FIGS. 10A, 10B, 10C, and 10D, memory cell 1010 comprises first bit line terminal 1011, first word line terminal 1012, first control gate terminal 1013, first erase gate terminal 1014, and first source line terminal 1015, as would be the case if memory cell 1010 follows the design of memory cell 410 in FIG. 4. Strap cell 1020 could be one of four different types of strap cells: erase gate strap cell 1020-1 (shown in FIG. 10A), source line strap cell 1020-2 (shown in FIG. 10B), control gate strap cell 1020-3 (shown in FIG. 10C), and word line strap cell 1020-4 (shown in FIG. 10D).

1. Erase Gate Strap Cell

With reference to FIG. 10A, strap cell 1020 can be erase gate strap cell 1020-1, comprising second bit line terminal 1021, second word line terminal 1022, second control gate terminal 1023, second erase gate terminal 1024, second source line terminal 1025, and erase gate contact 1034, where erase gate contact 1034 connects second erase gate terminal 1024 to a structure (such as a low voltage or high voltage decoder) outside of the array containing memory cell 1010 and strap cell 1020-1 that drives the erase gate line 1104 connected to second erase gate terminal 1024 as needed during program, erase, and read operations. Second erase gate terminal 1024 is further connected to erase gate line 1104 since it is in the same row as memory cell 1010. Memory cell 1010 comprises a first word line terminal 1012, a first control gate terminal 1013, an first erase gate terminal 1014, a first source line terminal 1015 and a first bit line terminal 1011.

FIG. 11A depicts an example of an array containing erase gate strap cell 1020-1. Array 1100-1 comprises bit lines 1101, word lines 1102a and 1102b, control gate lines 1103a and 1103b, erase gate line 1104, and source line 1105. Source line 1105 is located underneath erase gate line 1104, and therefore from this view would appear to be the same line even though they are separate in the three-dimensional space.

Exemplary memory cell 1010 is depicted. The word line terminal (such as first word line terminal 1012 in FIG. 10) of cell 1010 is coupled to word line 1102*a*, the control gate terminal of memory cell 1010 (such as first control gate terminal 1013 in FIG. 10) is coupled to control gate line 1103*a*, the erase gate terminal (such as first erase gate terminal 1014 in FIG. 10) of cell 1010 is coupled to erase gate line 1104, and the source line terminal (such as first source line terminal 1015 in FIG. 10) of memory cell 1010 is coupled to source line 1105.

Bit lines 1101 are coupled to structures outside of array 1100 through bit line contacts 1106 (which are located at either end of each bit line).

Array 1100 also comprises erase gate strap 1110, which comprises exemplary erase gate strap cell 1020-1. Erase gate strap 1110 is coupled to erase gate line 1104, since it is in the same row, and thus erase gate line 1104 and erase gate terminal 1014 of memory cell 1010 are coupled to erase gate contact 1034. Strap cell 1020-1 and erase gate strap 1110 are not connected to any bit line contacts and therefore are not connected to its corresponding bit line to a structure outside of array 1100. As a result, strap cell 1020-1 and erase gate strap 1110 have no pull down function in the prior art.

2. Source Line Strap Cell

With reference to FIG. 10B, strap cell 1020 can be source line strap cell 1020-2. Source line strap cell 1020-2 comprises second bit line terminal 1021, second word line terminal 1022, second control gate terminal 1023, second source line terminal 1025, and source line contact 1035 and does not comprise an erase gate terminal (to provide room for source line contact 1035), where source line contact 1035 connects to a structure (such as a low voltage or high voltage decoder) outside of the array containing memory cell 1010 and strap cell 1020-2 that drives the source line connected to second source line terminal 1025 as needed during program, erase, and read operations. Memory cell 1010 comprises a first word line terminal 1012, a first control gate terminal 1013, a first erase gate terminal 1014, a first source line terminal 1015 and a first bit line terminal 1011.

FIG. 11B depicts an example of an array containing source line strap cell 1020-2. Array 1100-2-2 is similar to array 1100-1 of FIG. 11A, except that erase gate strap 1110 is replaced with source line strap 1120, which comprises exemplary source line strap cell 1020-2.

Source line strap 1120 is coupled to source line 1105, since it is in the same row, and thus source line 1105 and source line terminal 1015 of memory cell 1010 are coupled to source line contact 1035. Source line strap cell 1020-2 and source line strap 1120 are not connected to any bit line contacts and therefore are not connected via their associated bit line to a structure outside of array 1100-2. As a result, source line strap cell 1020-2 and source line strap 1120 performs no pull down function in the prior art.

3. Control Gate Strap Cell

With reference to FIG. 10C, strap cell 1020 can be control gate strap cell 1020-3. Control gate strap cell 1020-3 comprises second bit line terminal 1021, second word line terminal 1022, second control gate terminal 1023, second source line terminal 1025, control gate contact 1033, and source line contact 1035 and does not comprise an erase gate terminal (to provide room for source line contact 1035), where control gate contact 1033 and source line contact 1035 connect to structures (such as a low voltage or high voltage decoders) outside of the array containing memory cell 1010 and strap cell 1020-3 that drives the control gate line 1103*a* and source line 1105 connected to second control gate terminal 1023 and source line terminal 1025, respectively, as needed during program, erase, and read operations. Memory cell 1010 comprises a first word line terminal 1012, a first control gate terminal 1013, a first erase gate terminal 1014, a first source line terminal 1015 and a first bit line terminal 1011.

FIG. 11C depicts an example of an array containing control gate line strap cell 1130. Array 1100-3 is similar to array 1100-1 and 1100-2 in FIGS. 11A and 11B, respectively, except that the except that erase gate strap 1110 or source line strap 1120, respectively, are replaced with control gate line strap 1130, which comprises exemplary control gate strap cell 1020-3. Control gate line strap 1130, particularly control gate strap cells 1020-3 (one of which is called out), are respectively coupled to control gate lines 1103*a* and 1103*b*, since they are in the same row, and thus control gate lines 1103*a*, 110*b*, and control gate terminals 1013 of memory cells 1010, respectively, are coupled to control gate line contacts 1033*a* and 1033*b*, respectively. Source line 1105 is coupled to second source line terminal 1025, since they are in the same row, and thus source line 1105 is coupled to source line contact 1035. Control gate line strap cell 1020-3 and control gate line strap 1130 are not connected to any bit line contacts and therefore are not connected via their associated bit line to a structure outside of array 1100-3. As a result, control gate line strap cell 1020-3 and control gate line strap 1130 perform no pull down function in the prior art.

4. Word Line Strap Cell

With reference to FIG. 10D, strap cell 1020 can be word line strap cell 1020-4. Word line strap cell 1020-4 comprises second bit line terminal 1021, second word line terminal 1022, second control gate terminal 1023, second source line terminal 1025, word line contact 1032, and source line contact 1035 and does not comprise an erase gate terminal (to provide room for source line contact 1035), where word line contact 1032 and source line contact 1035 connect to structures (such as a low voltage or high voltage decoders) outside of the array containing memory cell 1010 and strap cell 1020-4 that drive the word line and source line connected to word line contact 1032 and source line contact 1035, respectively, as needed during program, erase, and read operations. Memory cell 1010 comprises a first word line terminal 1012, a first control gate terminal 1013, a first erase gate terminal 1014, a first source line terminal 1015 and a first bit line terminal 1011.

FIG. 11D depicts an example of an array containing word line strap cell 1020-4. Array 1100-4 is similar to arrays 1100-1, 1100-2, and 1100-3 of FIGS. 11A, 11B, and 11C, respectively, except that the except that erase gate strap 1110, source line strap 1120 or control gate line strap 1130, respectively, are replaced with word line strap 1140, which comprises exemplary word line strap cell 1020-4.

Word line strap 1140, particularly word line strap cells 1020-4 (one of which is called out), are coupled to word lines 1102*a* and 1102*b*, since they are in the same row, respectively, and thus word lines 1102*a* and 1102*b* and word line terminals 1012 of memory cells 1010, are coupled to word line contacts 1032*a* and 1032*b*, respectively. Source line 1105 is coupled to second source line terminal 1025, since they are in the same row, and thus source line 1105 is coupled to source line contact 1035. Strap cell 1020-4 and word line strap 1140 are not connected to any bit line contacts and therefore are not connected via their associated bit line to a structure outside of array 1100-4. Word line strap cell 1020-4 and word line strap 1140 therefore perform no pull down function in the prior art.

With reference again to FIGS. 10A-10D and 11A-11D, and as indicated above, because memory cell 1010 and strap cell 1020 are located in the same row, first source line terminal 1015 of memory cell 1010 is coupled to the same source line as second source line terminal 1025 of strap cell 1020, first word line terminal 1012 of memory cell 1010 is coupled to the same word line as second word line terminal 1022 of strap cell 1020, first control gate terminal 1013 of memory cell 1010 is coupled to the same control gate line as second control gate terminal 1023 of strap cell 1020, and first erase gate terminal 1014 of memory cell 1010 is coupled to the same erase gate line as second erase gate terminal 1024 (if present) of strap cell 1020.

In the example shown in FIGS. 10A-10D and 11A-11D, memory cell 1010 and strap cell 1020 follow the design of memory cell 410 in FIG. 4, with the exceptions described above for strap cells 1020-2, 1020-3, and 1030-4. Memory cell 1010 and strap cell 1020 also can follow the design of memory cell 310 in FIG. 3 or memory cell 510 in FIG. 5 (in which case first and second erase gate terminals 1014 and 1024 will not be present), of memory cell 610 in FIG. 6 (in which case first and second control gate terminals 1013 and 1023 will not be present), or of memory cell 110 in FIG. 1 or memory cell 210 in FIG. 2 (in which case first and second erase gate terminals 1014 and 1024 and first and second control gate terminals 1013 and 1023 will not be present).

Thus, a strap cell is a cell, not used for storing data, comprising at least one of an erase gate contact, a control gate contact, a source line contact and a word line contact which connect to a structure (such as a low voltage decoder or high voltage decoder) outside of the array containing the memory cells. The respective erase gate contact, control gate contact, source line contact and word line contact are vertical contacts which connect to a metal line, which metal line are connected to the structure (such as a low voltage decoder or high voltage decoder) outside of the array containing the memory cells.

What is needed is a new technique for pulling source lines to ground in a flash memory system that utilizes less die space than the previous design disclosed by Applicant and discussed above with reference to FIGS. 8-9.

SUMMARY OF THE INVENTION

In the embodiments described below, a flash memory device utilizes existing strap cells in the array in source line pull down circuits.

In one embodiment, a memory system comprises a memory cell comprising a first bit line terminal and a first source line terminal; a strap cell comprising a second bit line terminal and a second source line terminal; a source line coupled to the first source line terminal and the second source line terminal; and a pull down circuit that selectively couples the second bitline terminal to ground when the memory cell is being read or erased and to a voltage source when the memory cell is being programmed.

In certain embodiments, the memory cell comprises a first word line terminal and the strap cell comprises a second word line terminal. In certain embodiments, the memory cell comprises a first control gate terminal and the strap cell comprises a second control gate terminal. In certain embodiments, the memory cell comprises a first erase gate terminal and the strap cell comprises a second erase gate terminal.

In certain embodiments, the strap cell is a source line strap cell, wherein the second source line terminal is connected to a source line contact. In certain embodiments, the strap cell is a word line strap cell, wherein the second word line terminal is connected to a word line contact. In certain embodiments, the strap cell is a control gate strap cell, wherein the second control line terminal is connected to a control gate contact. In certain embodiments, the strap cell is an erase gate strap cell wherein the second erase gate terminal is connected to an erase gate contact.

BRIEF DESCRIPTION OF THE DRAWINGS

FIG. 10B depicts a prior art memory cell and source line strap cell.

FIG. 11C depicts a prior art memory array comprising a control gate strap.

DETAILED DESCRIPTION OF THE
PREFERRED EMBODIMENTS

Figure 12:
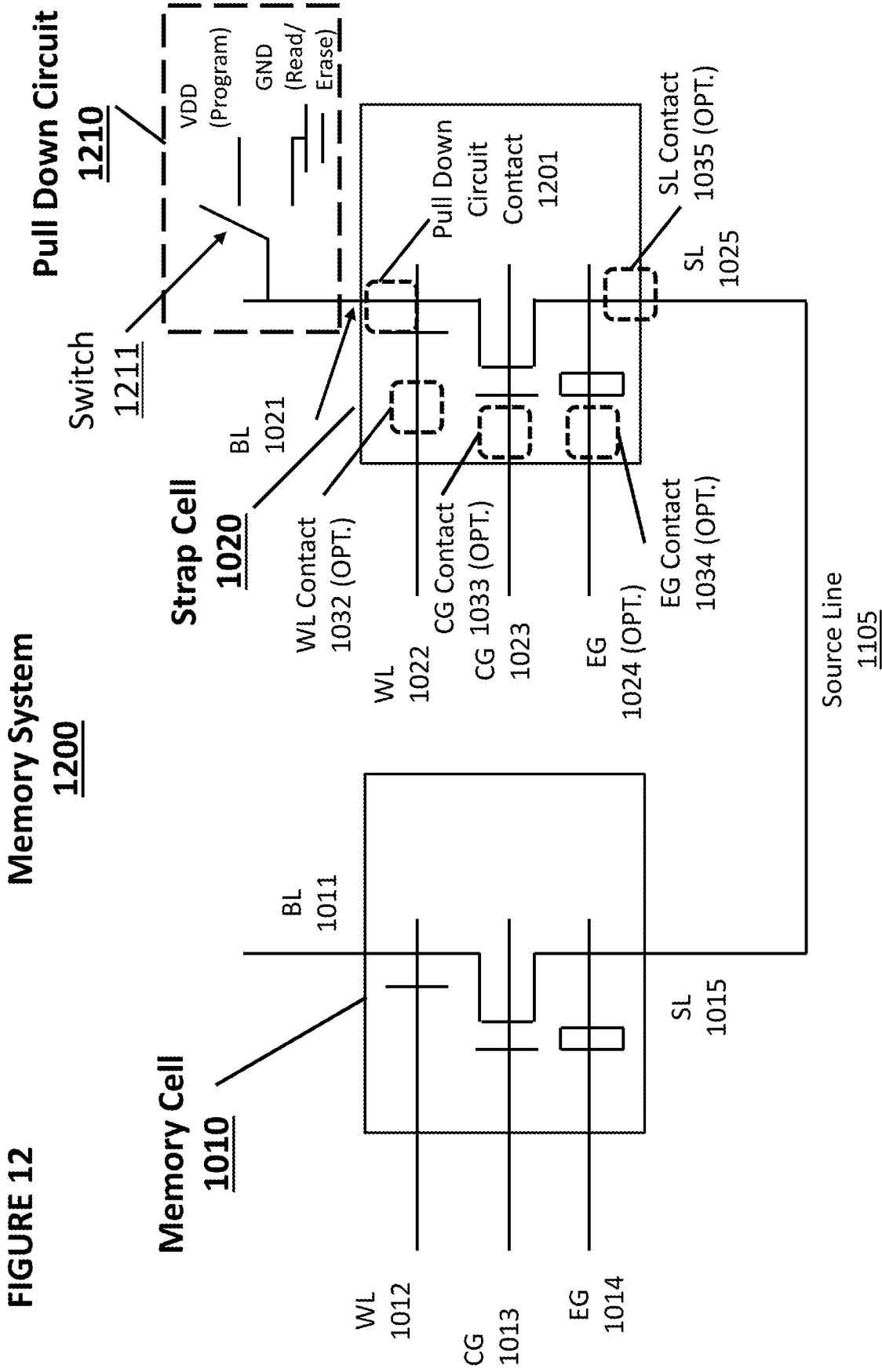
FIG. 12 depicts an embodiment with a strap cell used as pull down circuit for a source line.

FIG. 12 depicts an embodiment with a strap cell used as a pull down circuit for a source line. Memory system 1200 comprises memory cell 1010, which comprises the same components described previously for memory cell 1010 with respect to FIGS. 10A-10D, in particular memory cell 1010 comprises a first word line terminal 1012, a first control gate terminal 1013, a first erase gate terminal 1014, a first source line terminal 1015 and a first bit line terminal 1011. Memory system 1200 also comprises strap cell 1020, which can be any of strap cells 1020-1, 1020-2, 1020-3, and 1020-4 described previously with respect to FIGS. 10A-10D and 11A-11D.

Unlike in the prior art, strap cell 1020 comprises pull down circuit contact 1201. Second bit line terminal 1021 of strap cell 1020 is connected to pull down circuit contact 1201 (which can comprise, for example, a via between layers), which in turn connects outside of the memory array to pull down circuit 1210. Pull down circuit 1210 comprises switch 1211 that, in response to a control signal, will be selectively connected to ground or a voltage source such as VDD.

When memory cell 1010 is in read mode or erase mode, first source line terminal 1015 is coupled to source line 1105, which is coupled to strap cell 1020 and pull down circuit 1210 to ground. Thus, first source line terminal 1015, source line 1105, and second source line terminal 1025 will be pulled down to ground through strap cell 1020. Optionally, more than one strap cell 1020 can be coupled to first source line terminal 1015 to strengthen the pull down of the first source line terminal 1015 and source line 1105 to ground so as to cause first source line terminal 1015 and source line 1105 to pull to ground faster.

When the memory cell 1010 is in program mode, second bit line terminal 1021 is coupled to an inhibit voltage source such as VDD through switch 1211 in pull down circuit 1210. This will place strap cell 1020 in a program inhibit mode, which maintains strap cell 1020 in an erased state, even while memory cell 1010 is programmed.

Strap cell 1020 is produced in a neutral state, in which it conducts current (equivalent to an erased state). When memory cell 1010 is erased, strap cell 1020 similarly experiences erase potentials, and thus remains in the erased state at all times, or optionally is not erased and is kept in a neutral state, in which current flows through strap cell 1020, since when memory cell 1010 is programmed, strap cell 1020 experiences inhibit program potentials responsive to pull down circuit 1210.

FIGS. 13-18 depict exemplary layouts of embodiments utilizing the four types of strap cells (erase gate strap cell 1020-1, source line strap cell 1020-2, control gate strap cell 1020-3, and word line strap cell 1020-4) for strap cell 1020, respectively.

Figure 13:
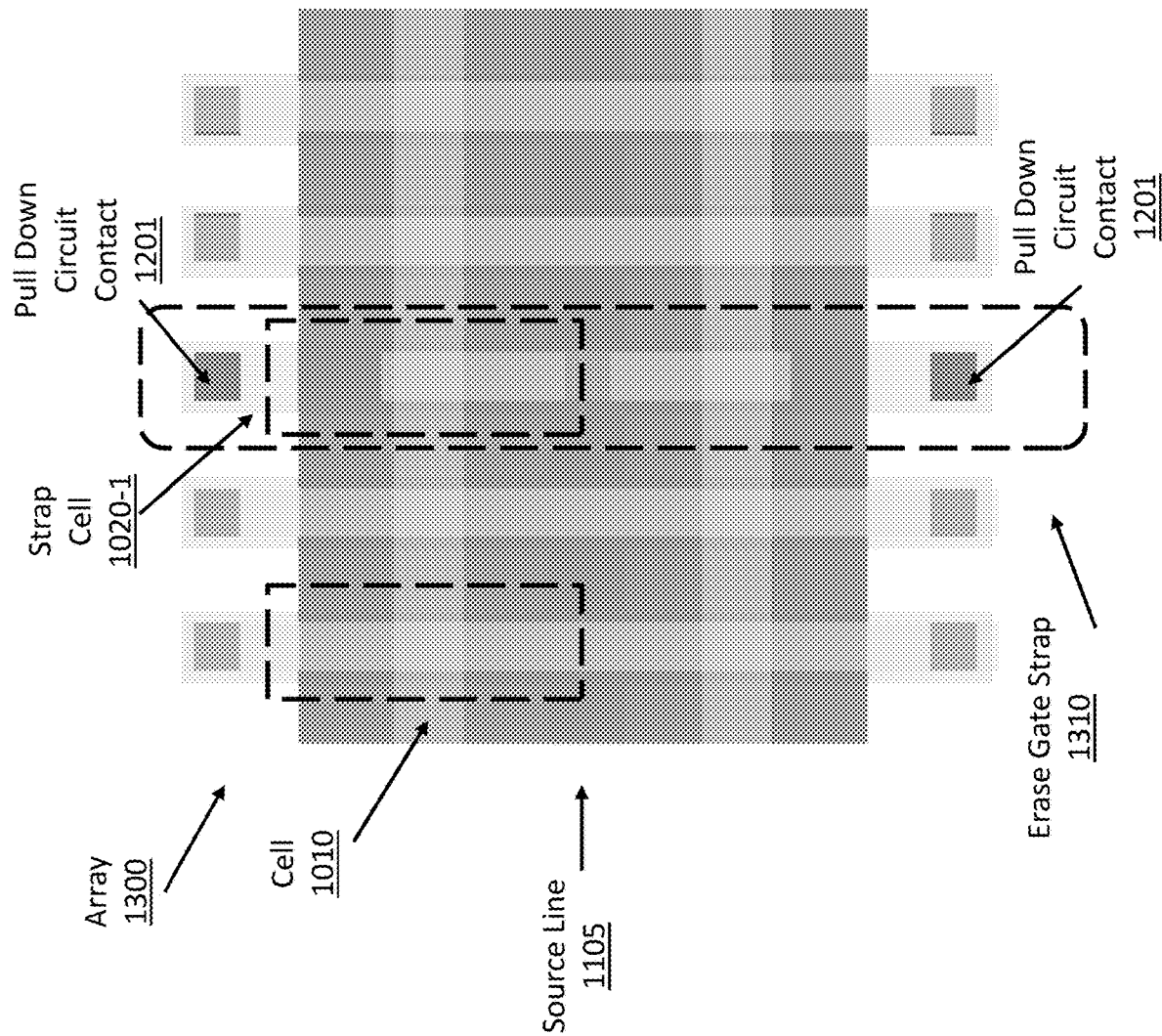
FIG. 13 depicts a layout diagram of an embodiment of a memory array comprising an erase gate strap used in a source line pull down circuit.

FIG. 13 depicts array 1300, which is similar to array 1100-1, except that the bit line terminal 1021 (not shown, but seen in FIG. 10A-10D) in erase gate strap 1310 is connected to pull down circuit contacts 1201 on both ends of the bit line, which in turn connects to a switchable contact of respective pull down circuits 1210 (not shown here, but shown in FIG. 12). Cell 1010 and erase gate strap cell 1020-1 share source line 1105, and source line 1105 is pulled down to ground through pull down circuit contacts 1201 and respective pull down circuits 1210 during a read mode or an erase mode, and is pulled to VDD through pull down circuit contacts 1201 responsive to pull down circuits 1210 during a program mode, as discussed previously with reference to FIG. 12.

Figure 14:
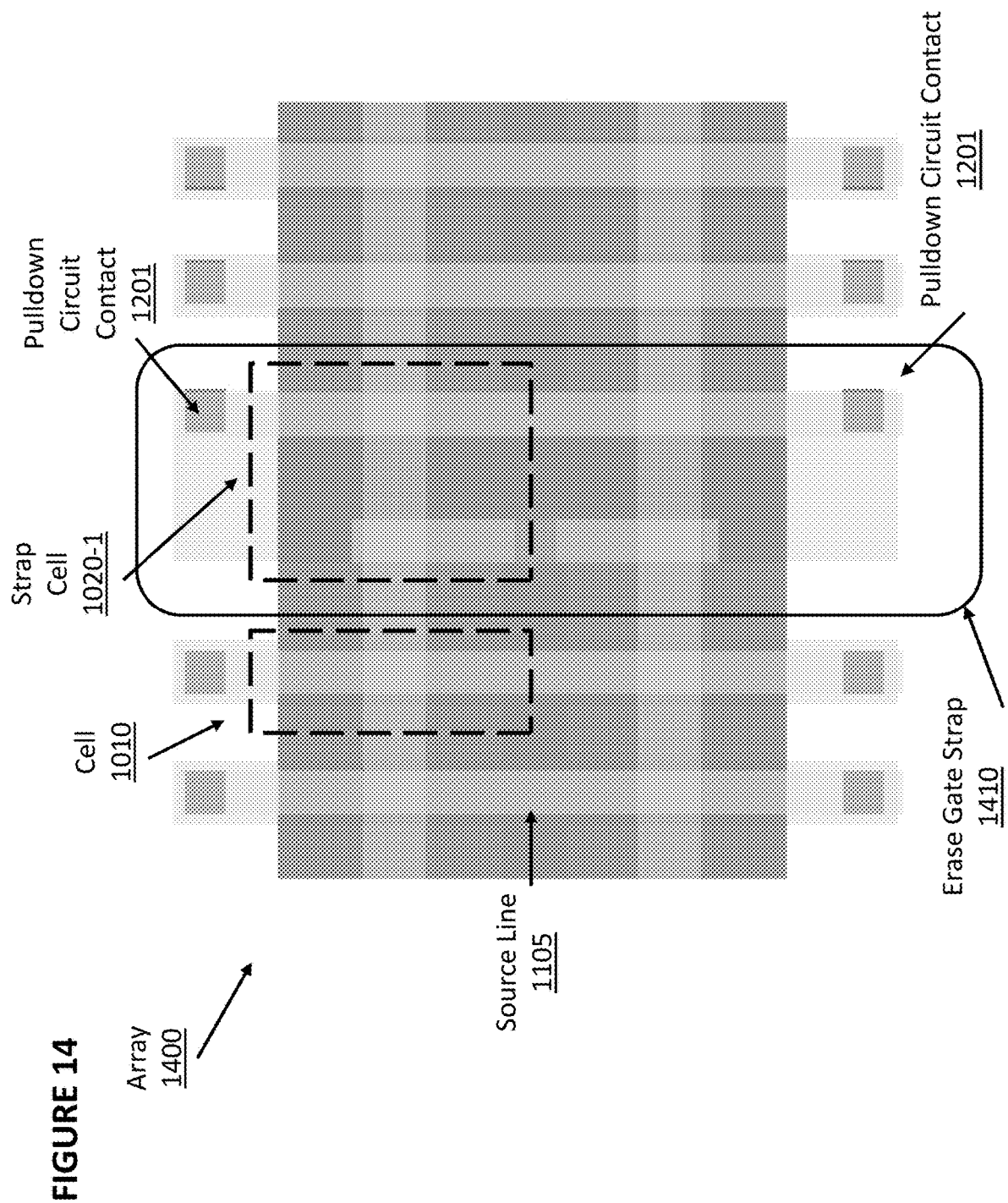
FIG. 14 depicts a layout diagram of another embodiment of a memory array comprising an erase gate strap used in a source line pull down circuit.

FIG. 14 depicts array 1400, which is similar to array 1300, except that erase gate strap 1410 is wider than erase gate strap 1310, and erase gate strap cell 1020-2 is wider in array 1400 than in array 1300, in this example, by a factor of 2×. This increases the pull down capability. Cell 1010 and erase gate strap cell 1020-2 share source line 1105, and source line 1105 is pulled down to ground through pull down circuit contacts 1201 responsive to pull down circuits 1210 during a read mode or an erase mode, and is pulled to VDD through pull down circuit contacts 1201 responsive to pull down circuits 1210 during a program mode, as discussed previously with reference to FIG. 12.

Figure 15:
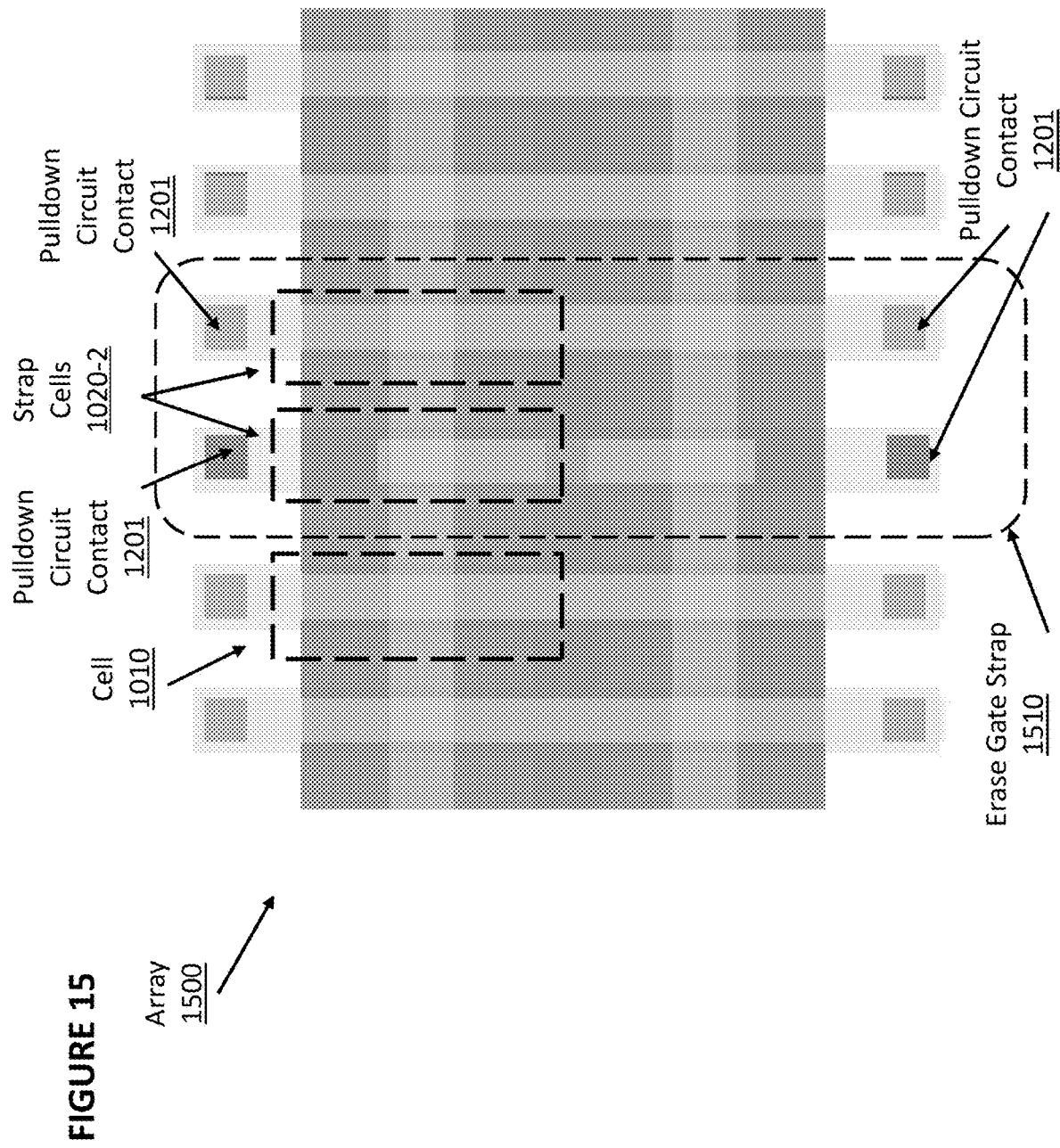
FIG. 15 depicts a layout diagram of another embodiment of a memory array comprising an erase gate strap used in a source line pull down circuit.

FIG. 15 depicts array 1500, which is similar to array 1400 of FIG. 14, except that (1) erase gate strap 1410 has been replaced with erase gate strap 1510, which comprises two columns of erase gate strap cells, each similar in size to a column of memory cells, (2) there are two erase gate strap cells 1020-2 instead of one, and (3) erase gate strap 1510 has four pull down circuit contacts 1201 each connected to a respective bit line terminal, instead of two. Array 1500 might be easier to manufacture than array 1400 due to the relative uniformity among the columns of normal cells and the two columns of erase gate strap cells.

Figure 16:
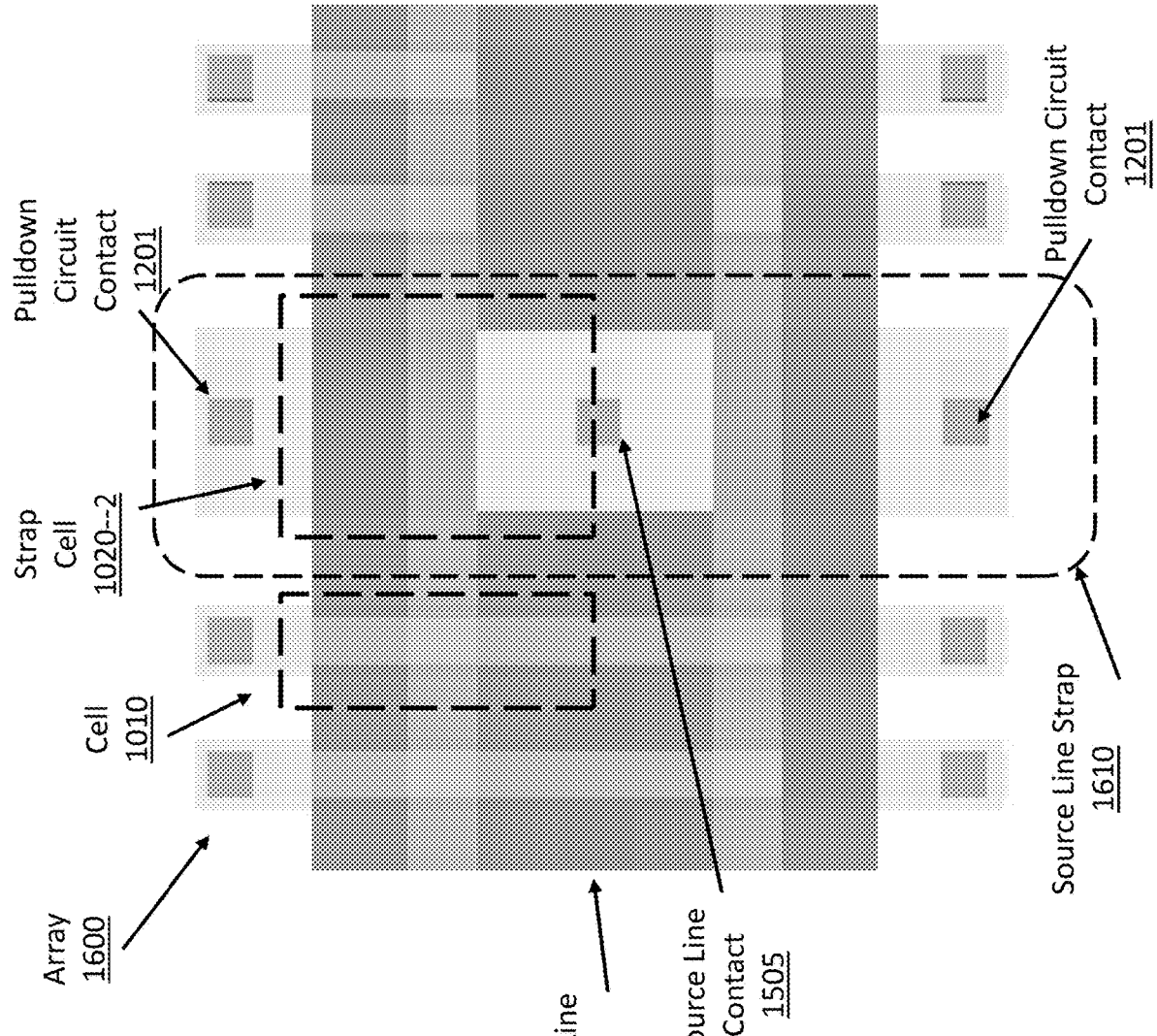
FIG. 16 depicts a layout diagram of an embodiment of a memory array comprising a source line strap used in a source line pull down circuit.

FIG. 16 depicts array 1600, which comprises source line strap 1610. Array 1600 is similar to array 1100-2 of FIG. 11B, except that he bit line terminal in source line strap 1610 is connected to pull down circuit contacts 1201 on both ends of the bit line, which in turn connects to a switchable contact of respective pull down circuits 1210 (not shown here, but shown in FIG. 12). Cell 1010 and source line strap cell 1020-2 share source line 1105, and shared source line 1105 is pulled down to ground through pull down circuit contact 1201 responsive to pull down circuits 1210 during a read or erase mode, and is pulled to VDD through pull down circuit contacts 1201 responsive to pull down circuits 1210 during a program mode, as discussed previously with reference to FIG. 12.

Figure 17:
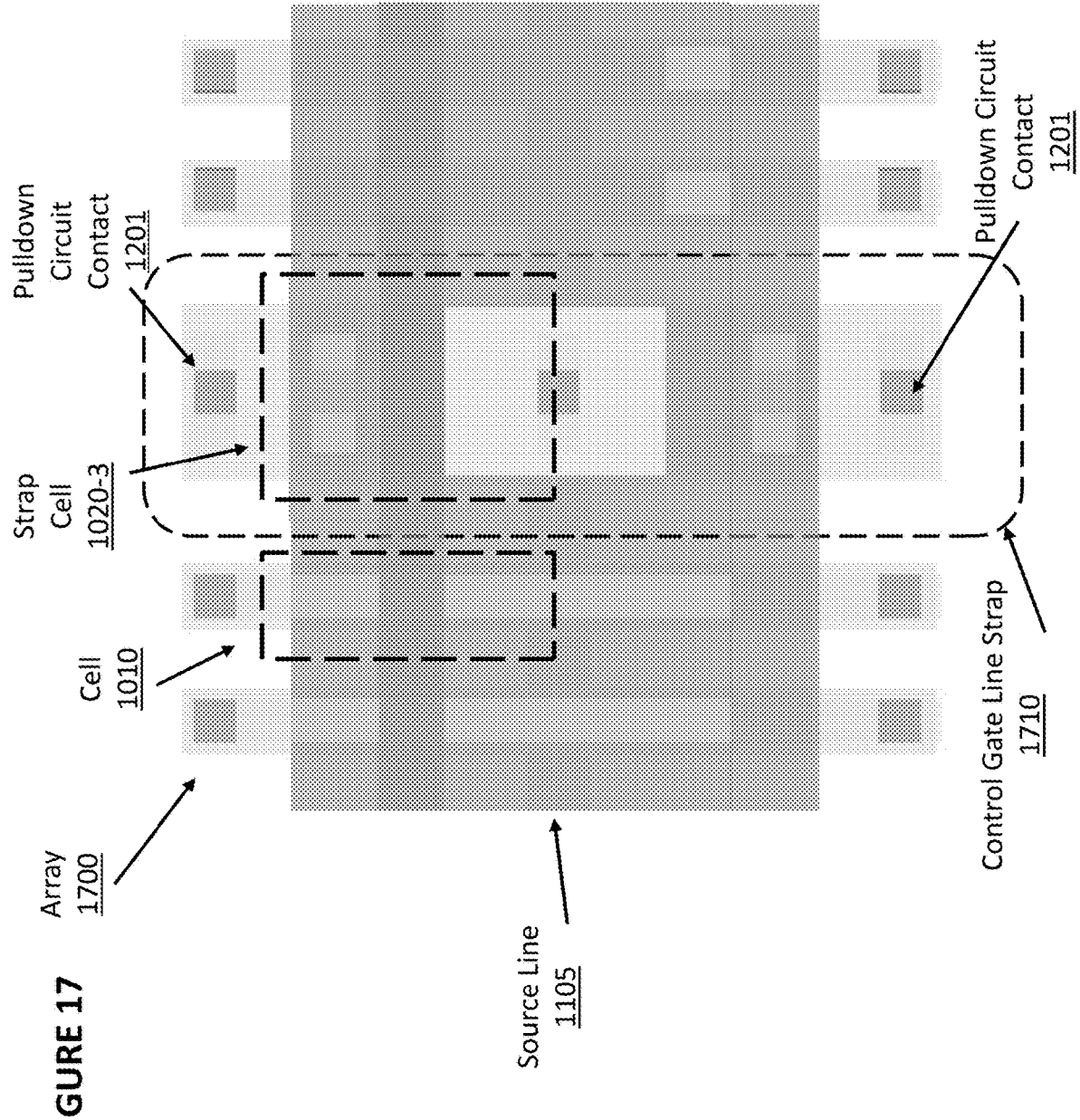
FIG. 17 depicts a layout diagram of an embodiment of a memory array comprising a control gate strap used in a source line pull down circuit.

FIG. 17 depicts array 1700, which comprises control gate line strap 1710. Array 1700 is similar to array 1100-3 of FIG. 11C, except that the bit line terminal in control gate line strap 1710 is connected to pull down circuit contacts 1201 on both ends of the bit line, which in turn connect to switchable contacts of respective pull down circuits 1210 (not shown here, but shown in FIG. 12). Cell 1010 and control gate strap cell 1020-3 share source line 1105, and source line 1105 is pulled down to ground through pull down circuit contacts 1201 responsive to pull down circuit 1210 during a read mode or erase mode, and is pulled to VDD through pull down circuit contacts 1201 responsive to pull down circuits 1210 during a program mode, as discussed previously with reference to FIG. 12.

Figure 18:
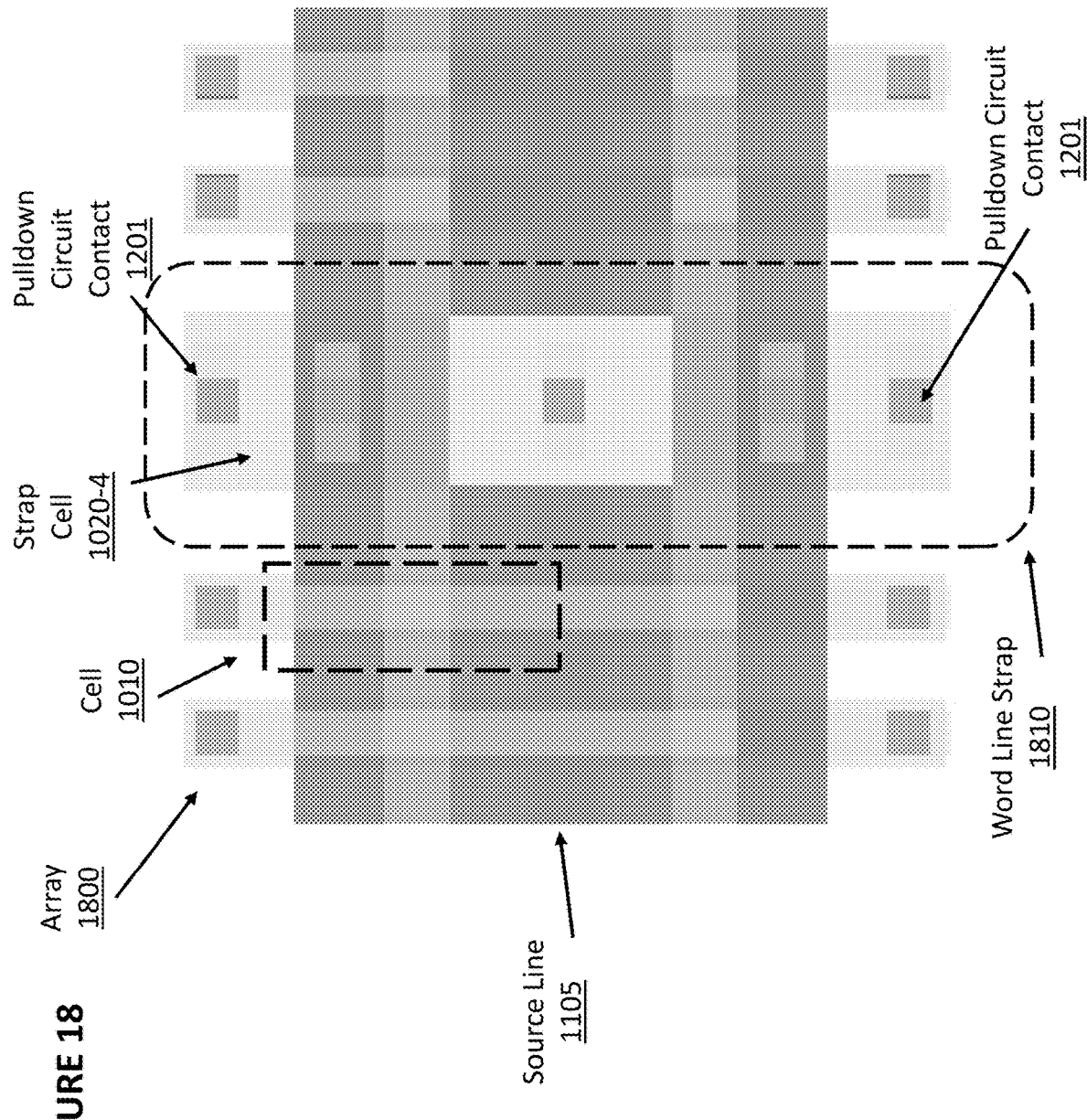
FIG. 18 depicts a layout diagram of an embodiment of a memory array comprising a word line strap used in a source line pull down circuit.

FIG. 18 depicts array 1800, which comprises word line strap 1810. Array 1800 is similar to array 1100-4 of FIG. 11D, except that the bit line terminals in word line strap 1810 are respectively connected to pull down circuit contacts 1201 on both ends of the bit line, which in turn connects to the switchable contacts of respective pull down circuits 1210 (not shown here, but shown in FIG. 12). Cell 1010 and word line strap cell 1020-4 share source line 1105, and source line 1105 is pulled down to ground through pull down circuit contacts 1201 responsive to pull down circuits 1210 during a read mode or erase mode, and is pulled to VDD through pull down circuit contacts 1201 responsive to pull down circuits 1210 during a program mode, as discussed previously with reference to FIG. 12.

Figure 1:
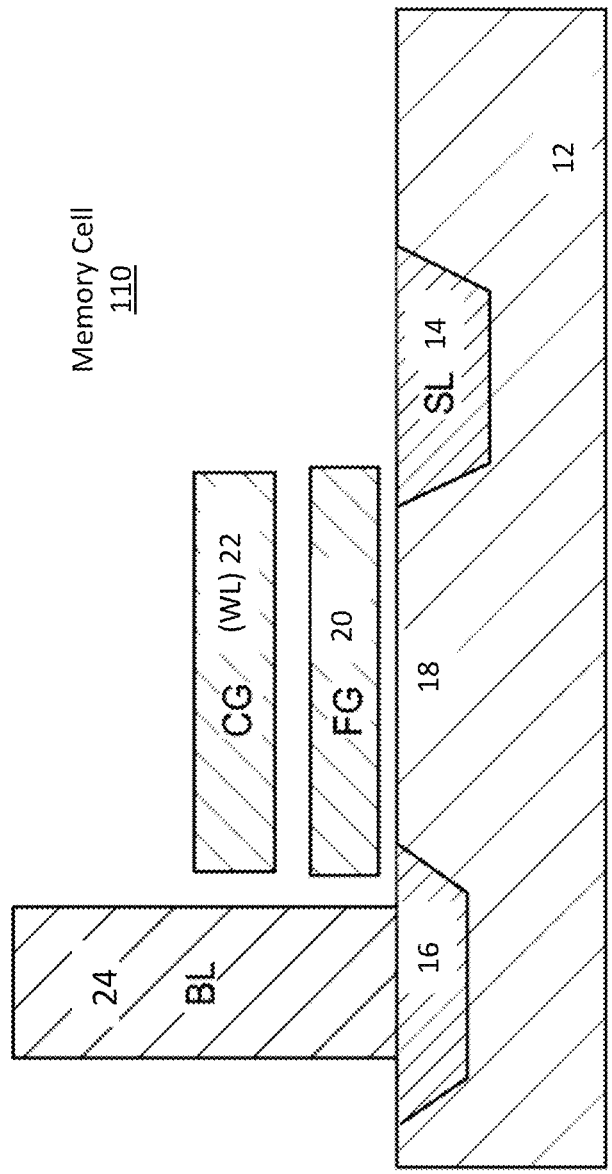
FIG. 1 is a cross-sectional view of a stacked-gate, non-volatile memory cell of the prior art to which the present invention can be applied.
Figure 2:
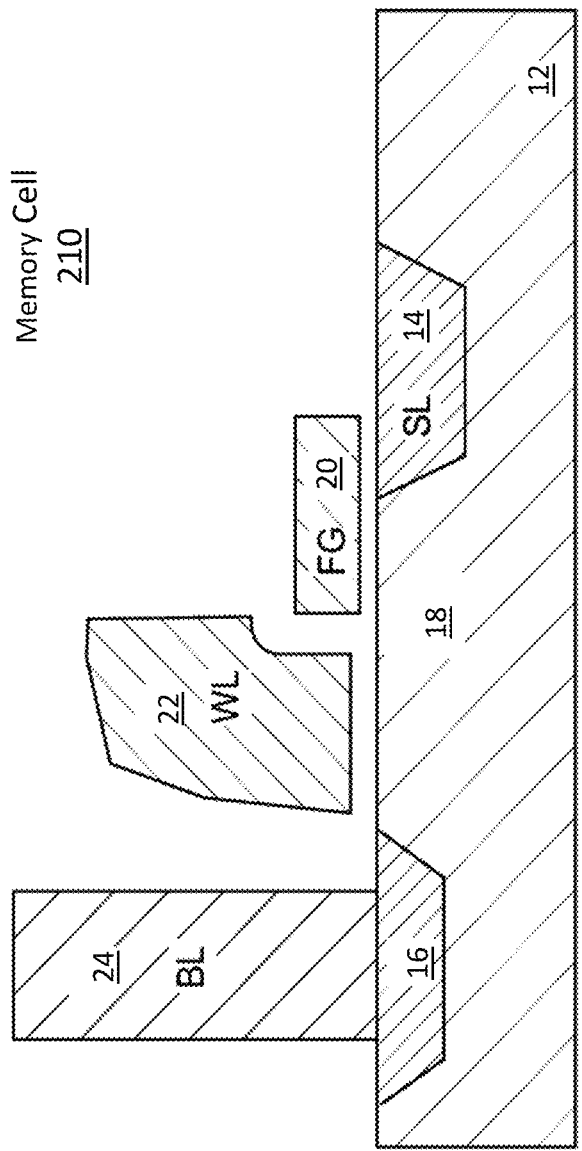
FIG. 2 is a cross-sectional view of a split-gate, non-volatile memory cell of the prior art to which the present invention can be applied.
Figure 3:
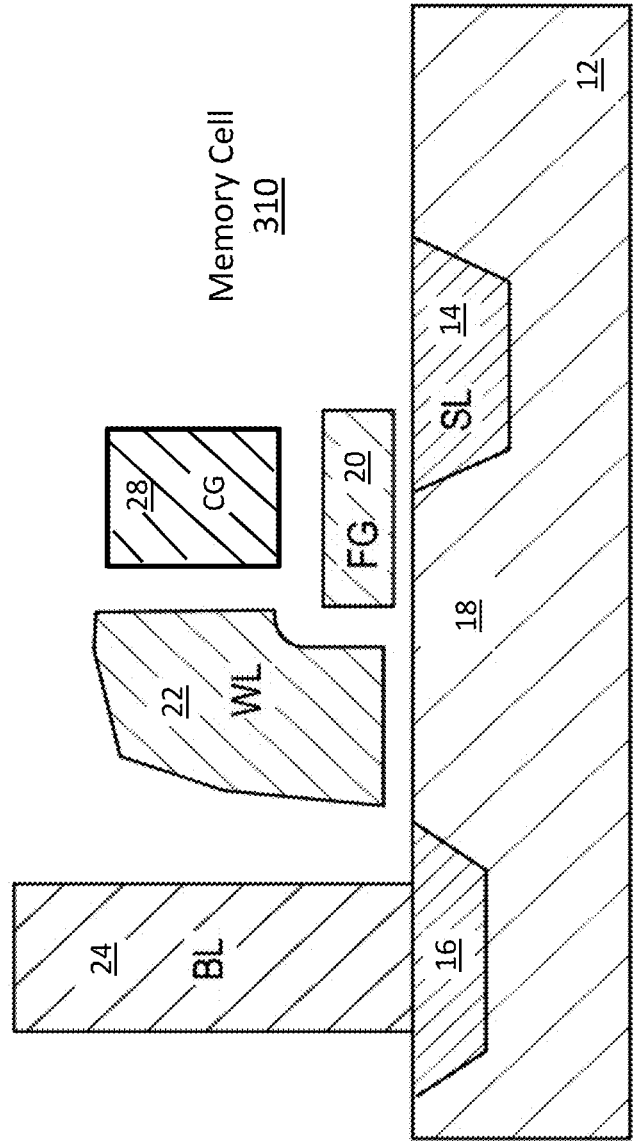
FIG. 3 is a cross-sectional view of a split-gate, non-volatile memory cell of the prior art to which the present invention can be applied.
Figure 4:
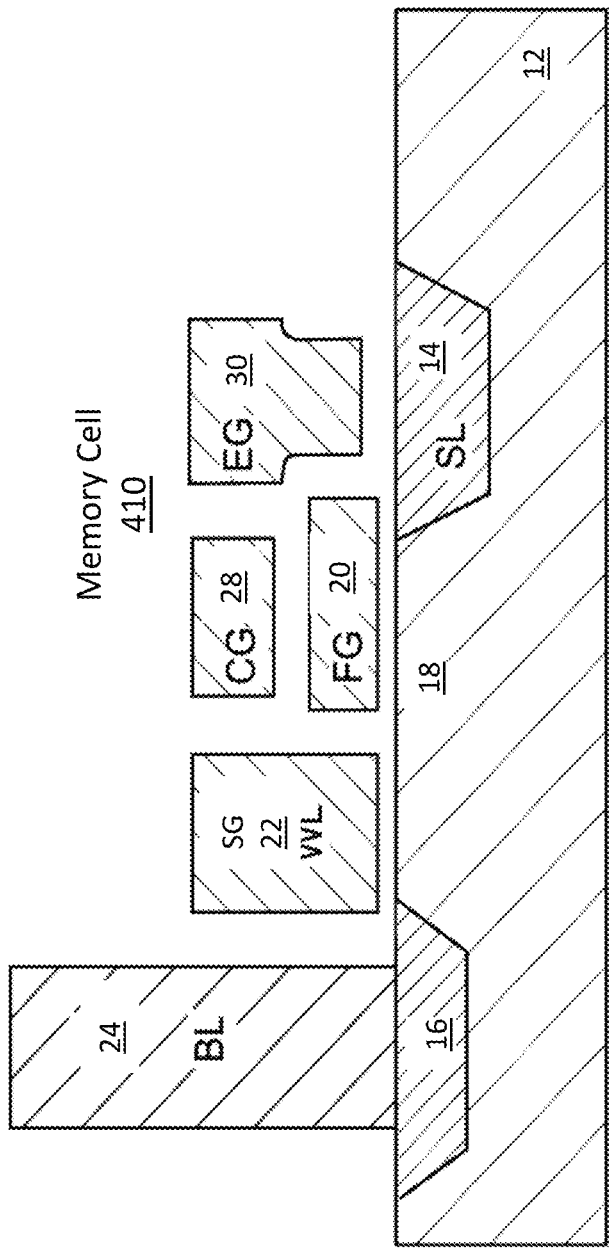
FIG. 4 is a cross-sectional view of a split-gate, non-volatile memory cell of the prior art to which the present invention can be applied.
Figure 5:
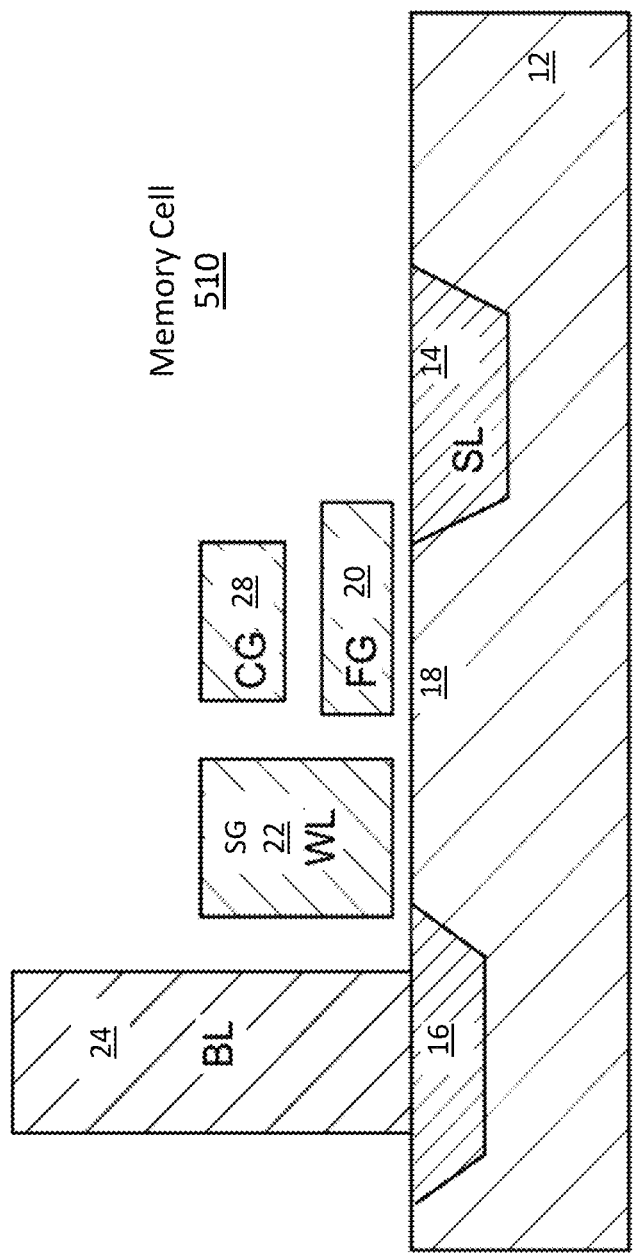
FIG. 5 is a cross-sectional view of a split-gate, non-volatile memory cell of the prior art to which the present invention can be applied.
Figure 6:
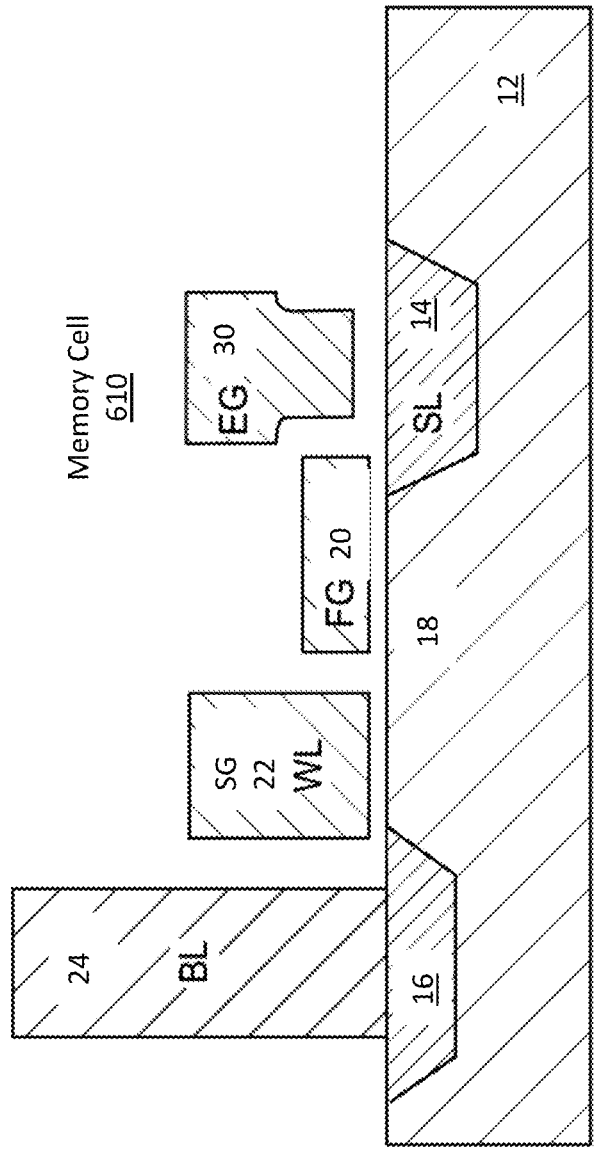
FIG. 6 is a cross-sectional view of a split-gate, non-volatile memory cell of the prior art to which the present invention can be applied.
Figure 7:
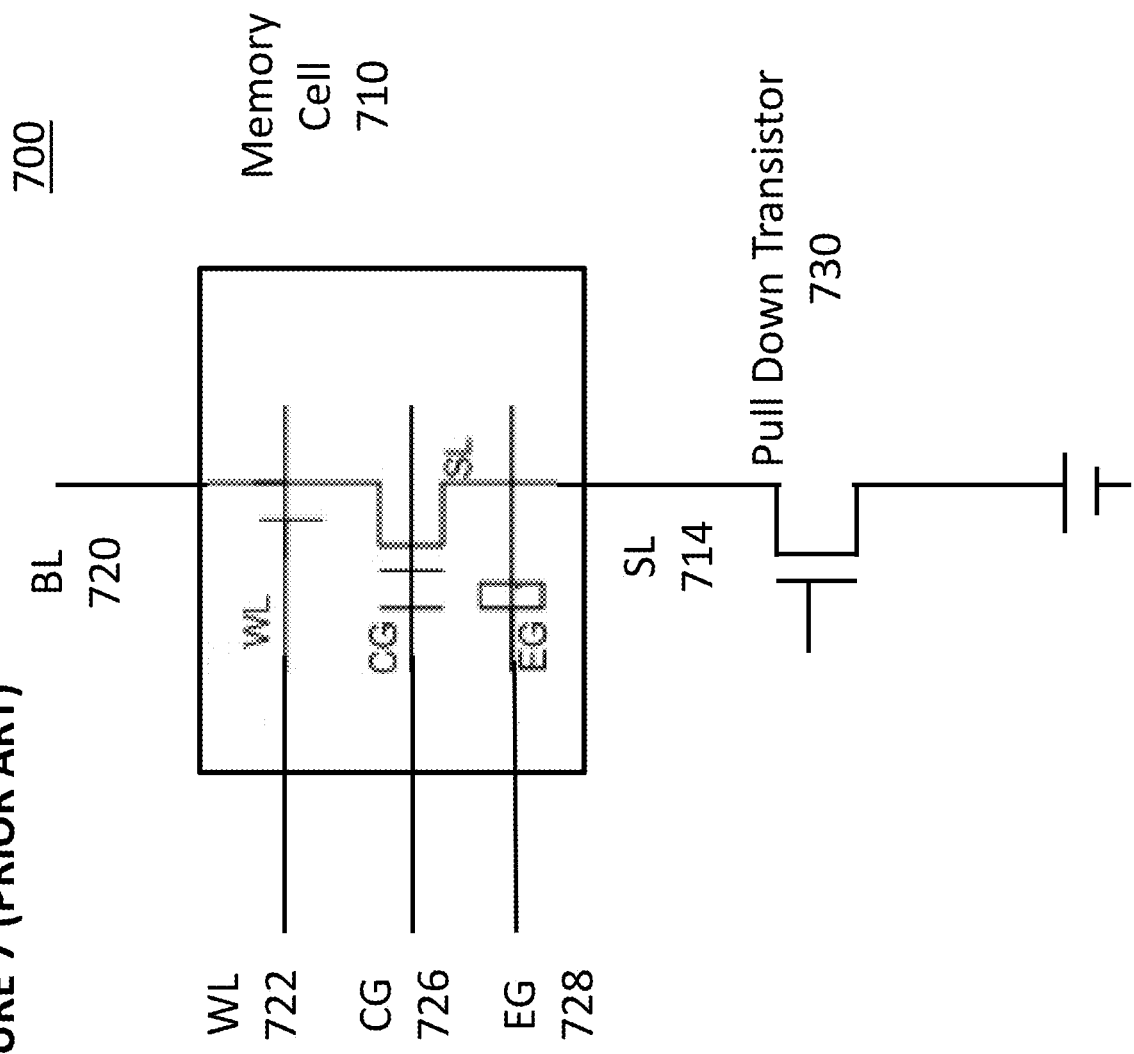
FIG. 7 depicts a prior art memory cell with a pull down transistor coupled to the source line.
Figure 8:
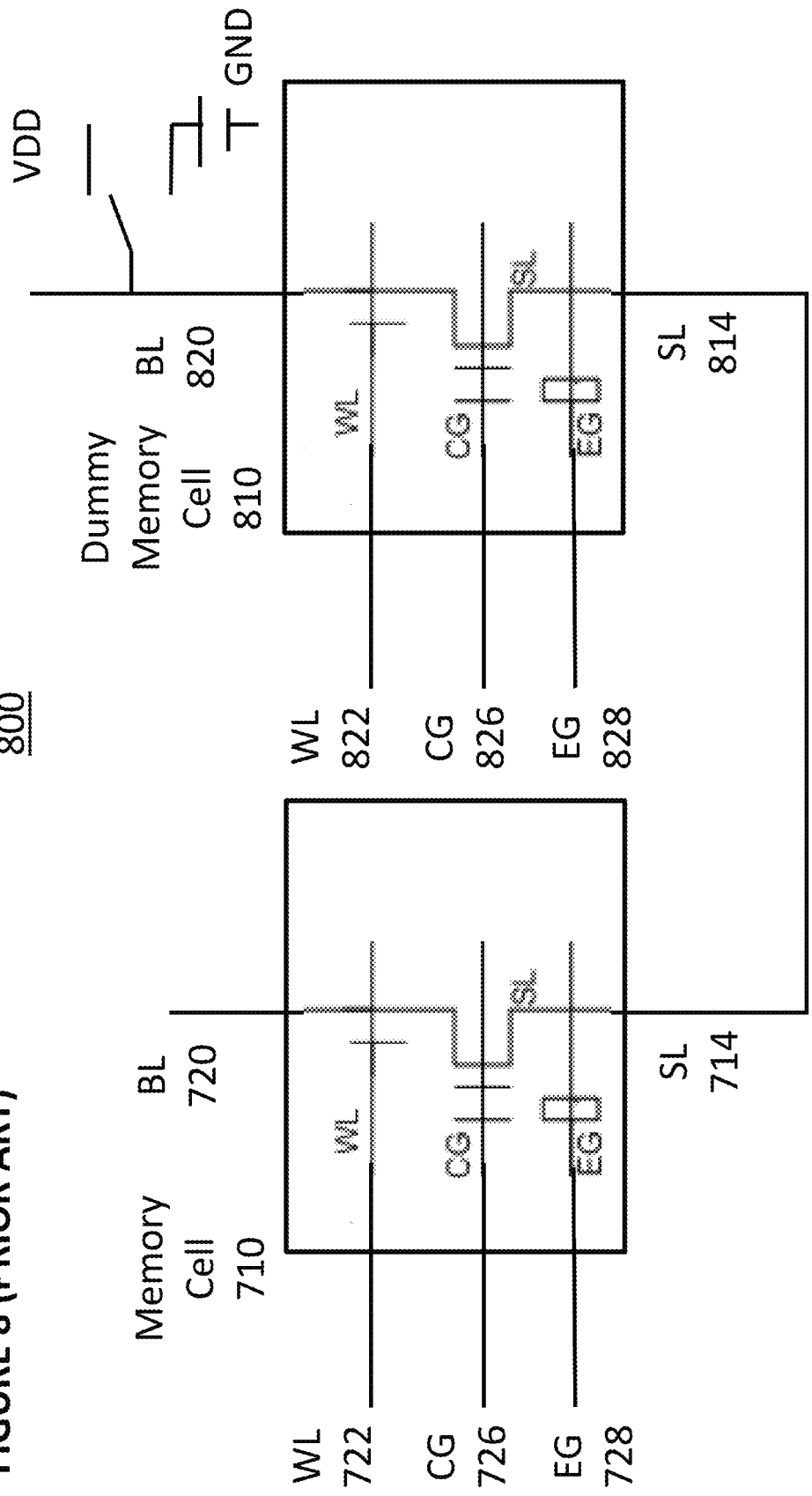
FIG. 8 depicts a design previously disclosed by Applicant where a dummy memory cell is used as a pull down circuit for a source line.
Figure 9:
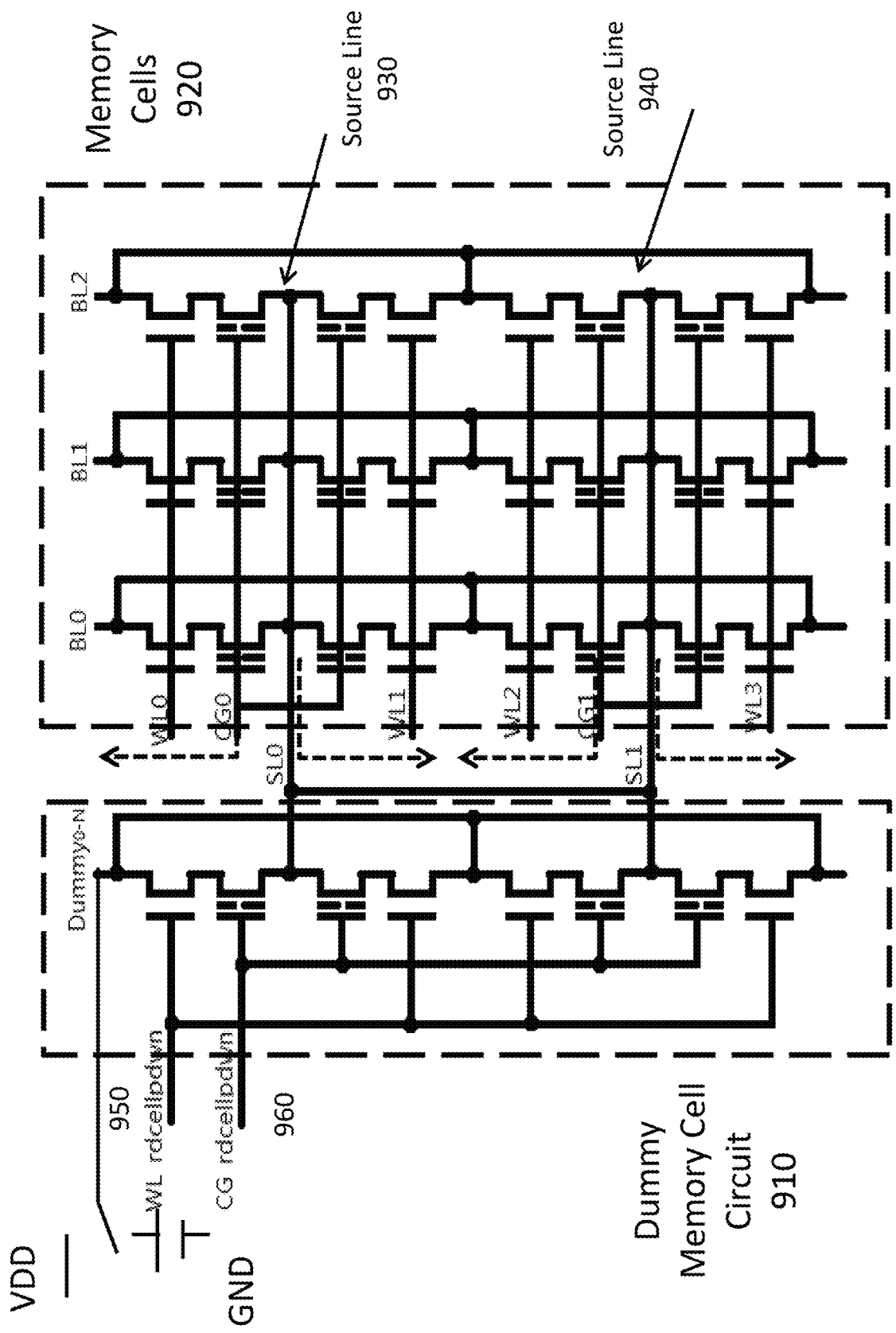
FIG. 9 depicts another design previously disclosed by Applicant where a plurality of dummy memory cells are used as a pull down circuit for a source line.
Figure 10A:
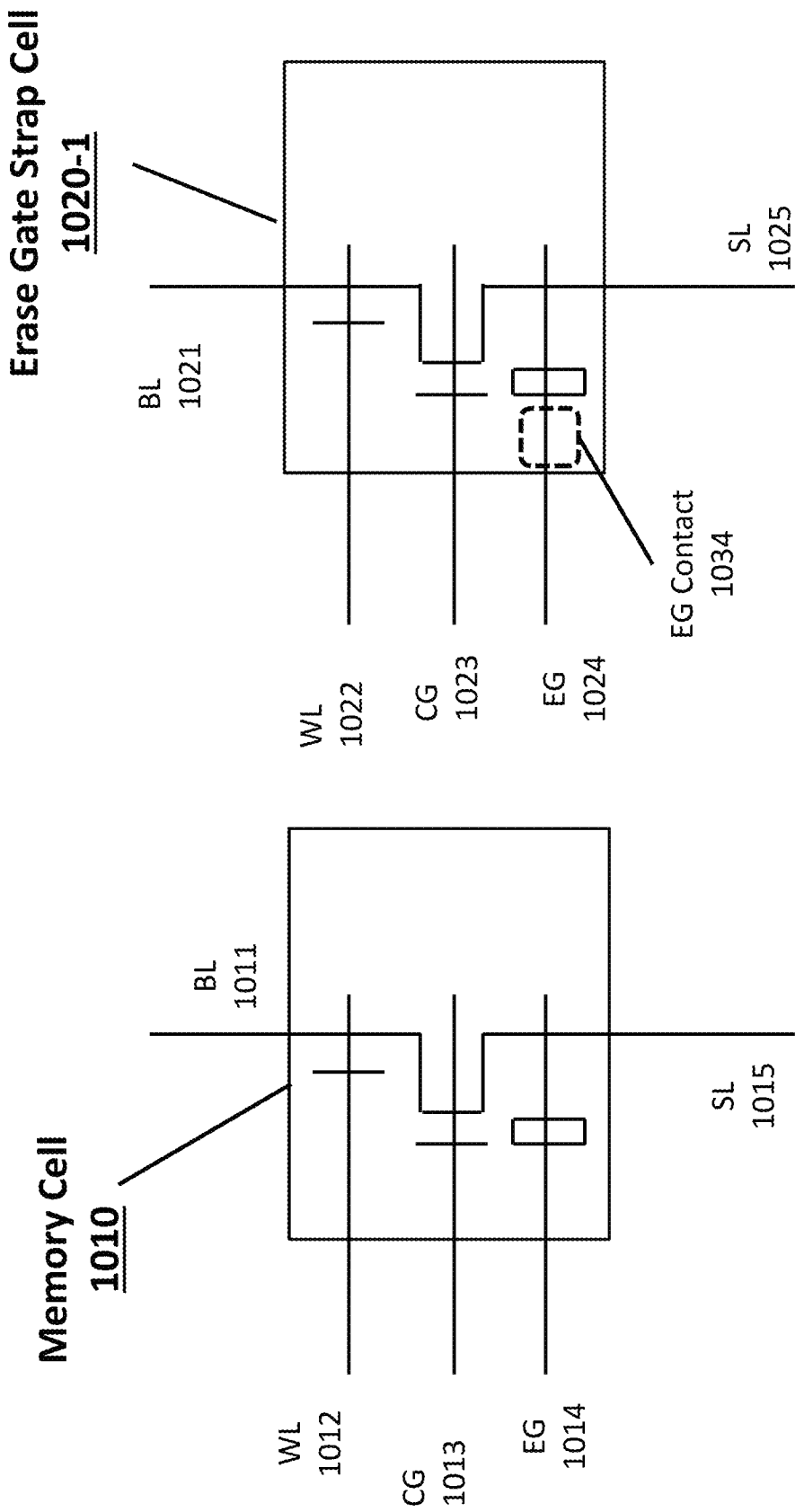
FIG. 10A depicts a prior art memory cell and erase gate strap cell.
Figure 10C:
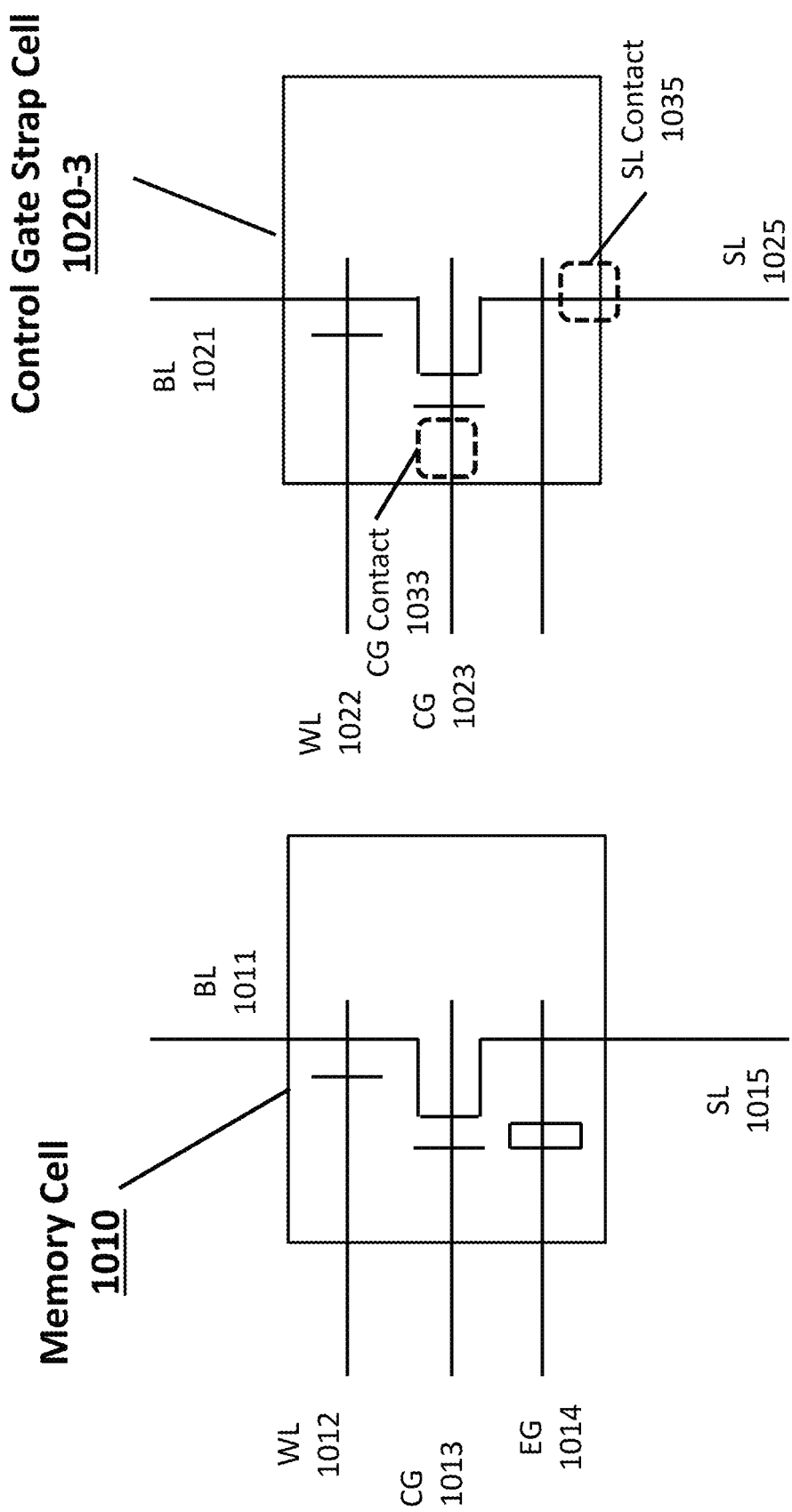
FIG. 10C depicts a prior art memory cell and control gate strap cell.
Figure 10D:
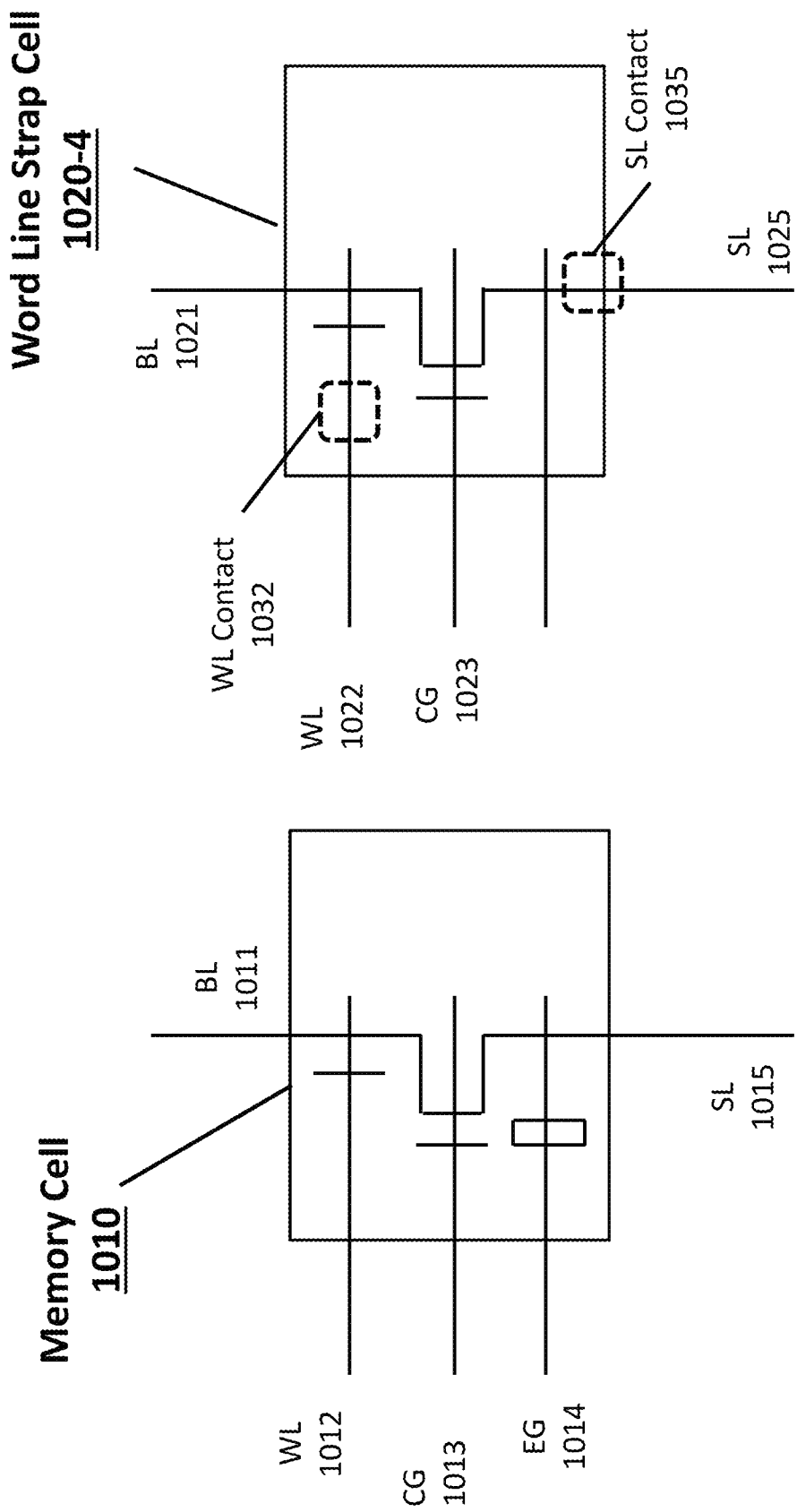
FIG. 10D depicts a prior art memory cell and word line strap cell.
Figure 11A:
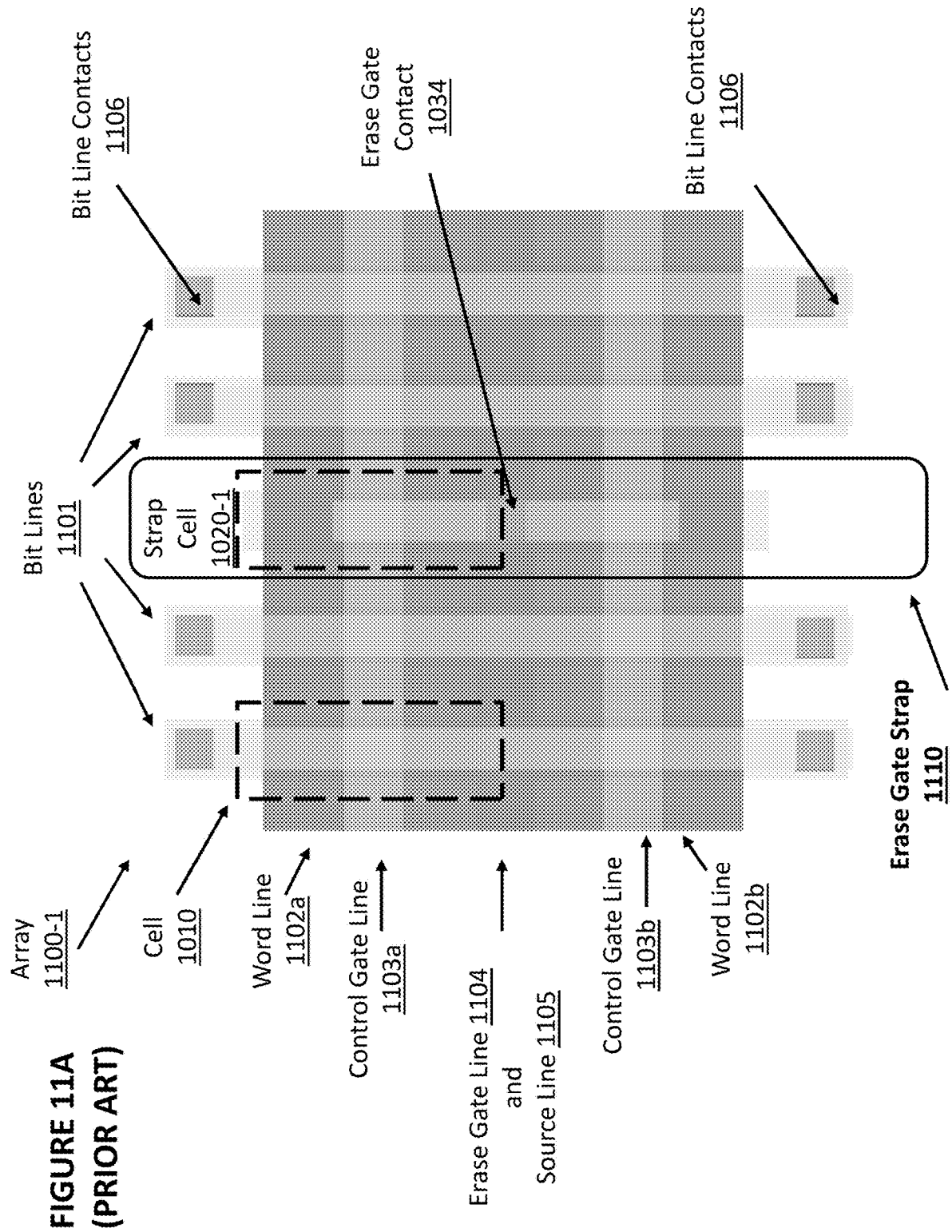
FIG. 11A depicts a prior art memory array comprising an erase gate strap.
Figure 11B:
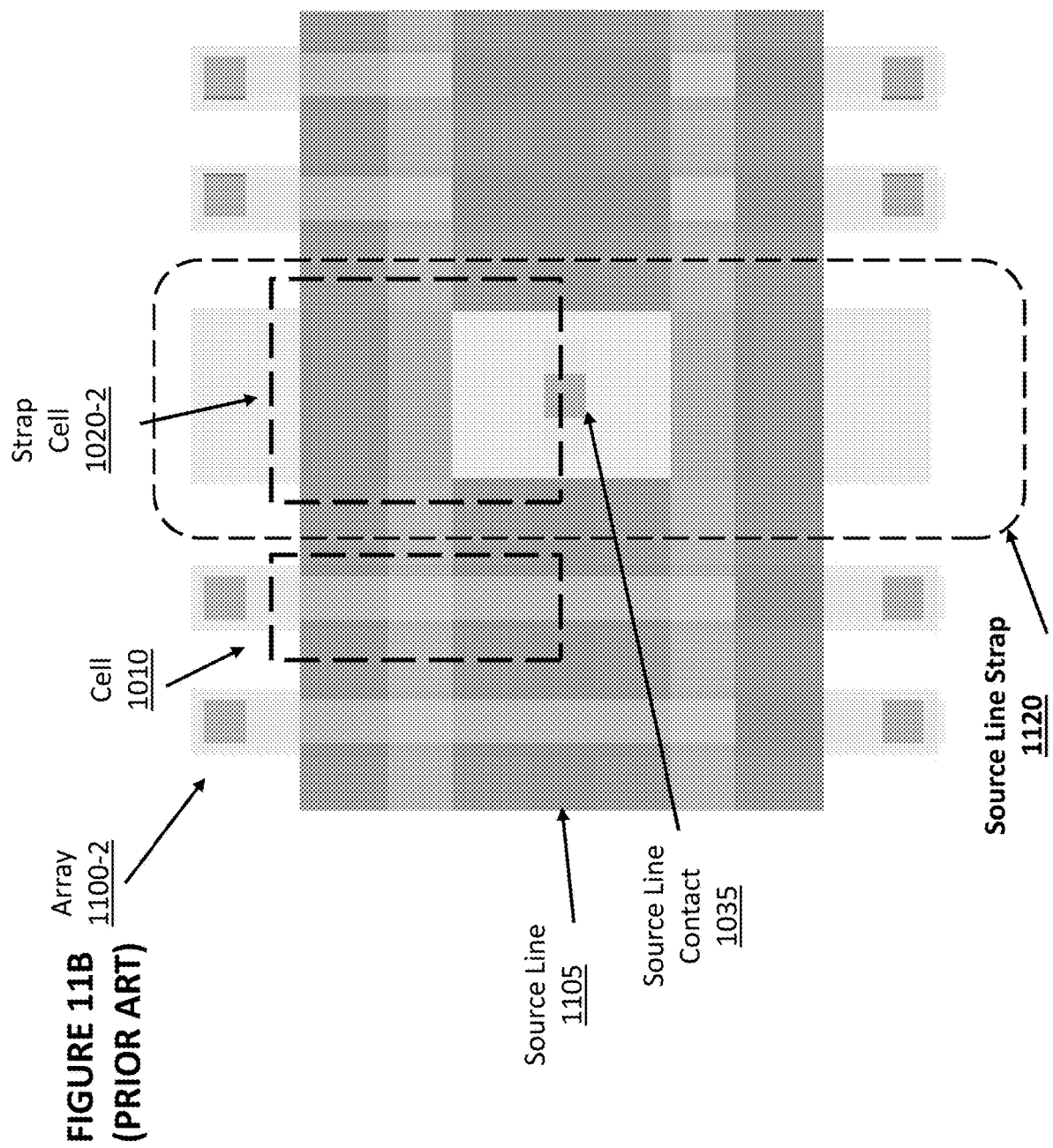
FIG. 11B depicts a prior art memory array comprising a source line strap.
Figure 11D:
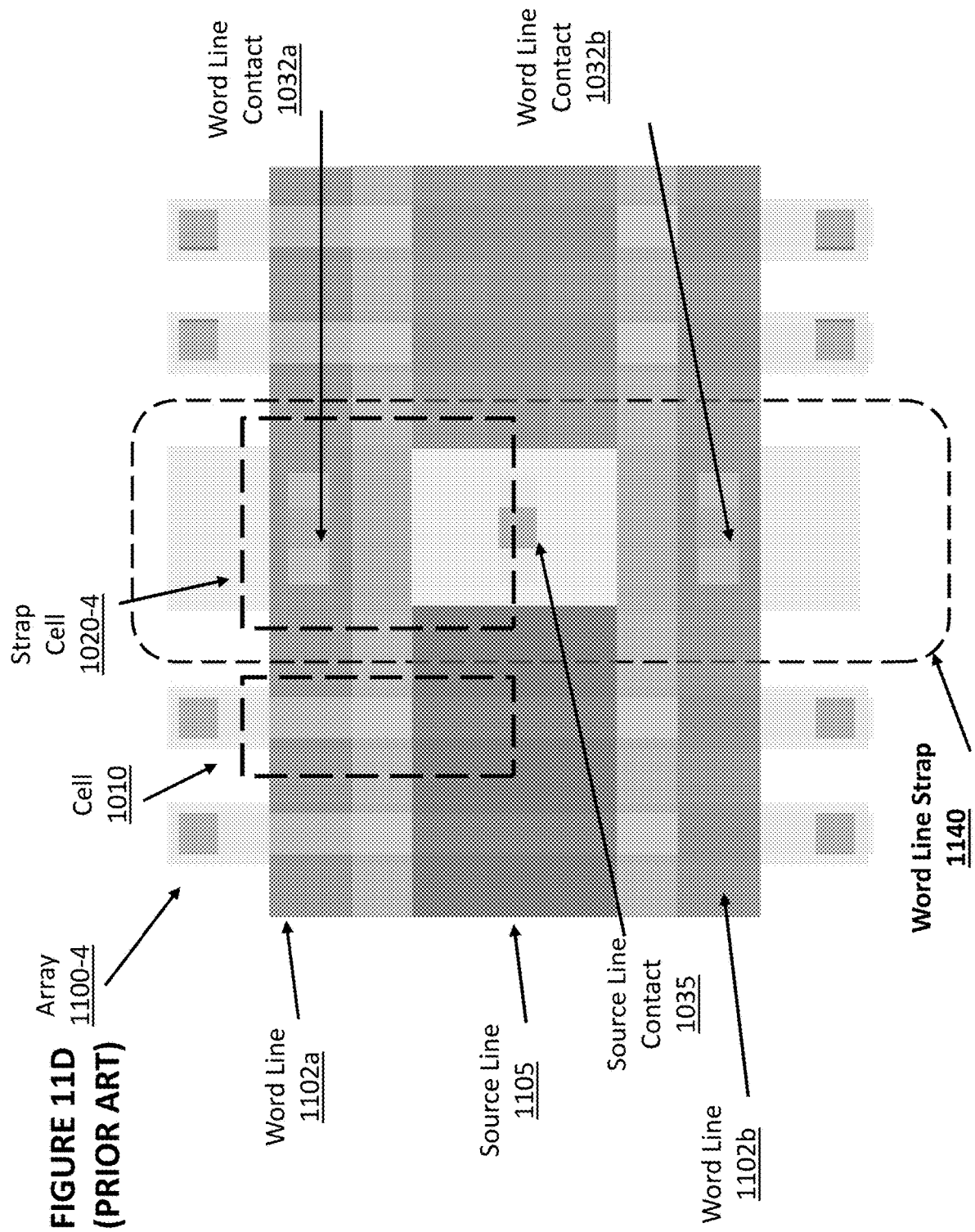
FIG. 11D depicts a prior art memory array comprising a word line strap.

The embodiments described above utilize less die space than the system of the prior art systems of FIGS. 8 and 9. This is a significant improvement that will reduce manufacturing complexity and cost.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), and "coupled" includes "directly coupled to" (no intermediate materials or elements therebetween that electrically connect the elements together) and "indirectly coupled to" (intermediate materials or elements therebetween that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A memory system comprising:
   a memory cell comprising a first bit line terminal and a first source line terminal;
   a first bit line coupled to the first bit line terminal;
   a strap cell comprising a second bit line terminal, a second source line terminal, a first pull down circuit contact, and a second pull down circuit contact;
   a second bit line coupled to the second bit line terminal, the first pull down circuit contact, and the second pull down circuit contact, wherein the first pull down circuit contact is located on one end of the second bit line and the second pull down circuit contact is located on an opposite end of the second bit line;
   a source line coupled to the first source line terminal and the second source line terminal; and
   a pull down circuit coupled to the first pull down circuit contact and the second pull down circuit contact that selectively couples the second bit line to ground when the memory cell is being read or erased and to a voltage source when the memory cell is being programmed.

2. The system of claim 1, wherein the memory cell comprises a first word line terminal and the strap cell comprises a second word line terminal.

3. The system of claim 2, wherein the memory cell comprises a first control gate terminal and the strap cell comprises a second control gate terminal.

4. The system of claim 3, wherein the memory cell comprises a first erase gate terminal and the strap cell comprises a second erase gate terminal.

5. The system of claim 4, wherein the strap cell is a source line strap cell, wherein the second source line terminal is connected to a source line contact.

6. The system of claim 4, wherein the strap cell is a word line strap cell, wherein the second word line terminal is connected to a word line contact.

7. The system of claim 4, wherein the strap cell is a control gate strap cell, wherein the second control gate terminal is connected to a control gate contact.

8. The system of claim 4, wherein the strap cell is an erase gate strap cell wherein the second erase gate terminal is connected to an erase gate contact.

9. The system of claim 3, wherein the strap cell is a source line strap cell, wherein the second source line terminal is connected to a source line contact.

10. The system of claim 3, wherein the strap cell is a word line strap cell, wherein the second word line terminal is connected to a word line contact.

11. The system of claim 3, wherein the strap cell is a control gate strap cell, wherein the second control line terminal is connected to a control gate contact.

12. The system of claim 2, wherein the strap cell is a source line strap cell, wherein the second source line terminal is connected to a source line contact.

13. The system of claim 2, wherein the strap cell is a word line strap cell, wherein the second word line terminal is connected to a word line contact.

14. The system of claim 1, wherein the strap cell is a source line strap cell, wherein the second source line terminal is connected to a source line contact.

* * * * *